United States Patent
Millward et al.

(10) Patent No.: US 8,404,124 B2
(45) Date of Patent: Mar. 26, 2013

(54) ALTERNATING SELF-ASSEMBLING MORPHOLOGIES OF DIBLOCK COPOLYMERS CONTROLLED BY VARIATIONS IN SURFACES

(75) Inventors: Dan B. Millward, Boise, ID (US); Donald Westmoreland, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 489 days.

(21) Appl. No.: 11/761,589

(22) Filed: Jun. 12, 2007

(65) Prior Publication Data
US 2008/0311347 A1 Dec. 18, 2008

(51) Int. Cl.
*B44C 1/22* (2006.01)
*B82B 3/00* (2006.01)
*H01L 21/302* (2006.01)
*B82Y 40/00* (2011.01)

(52) U.S. Cl. .......... 216/2; 216/17; 216/39; 216/41; 216/49; 216/83; 216/55; 216/67; 216/99; 427/98.5; 427/256; 438/700; 438/947; 977/888; 977/895; 977/900

(58) Field of Classification Search .......... None
See application file for complete search history.

(56) References Cited

U.S. PATENT DOCUMENTS

| | | | |
|---|---|---|---|
| 4,623,674 A | 11/1986 | Bailey, Jr. | |
| 4,877,647 A | 10/1989 | Klabunde | |
| 5,328,810 A | 7/1994 | Lowrey et al. | |
| 5,374,367 A | 12/1994 | Edamura et al. | |
| 5,382,373 A | 1/1995 | Carlson et al. | |
| 5,482,656 A | 1/1996 | Hiraoka et al. | |
| 5,512,131 A | 4/1996 | Kumar et al. | |
| 5,538,655 A | 7/1996 | Fauteux et al. | |
| 5,622,668 A | 4/1997 | Thomas | |
| 5,834,583 A | 11/1998 | Hancock et al. | |
| 5,849,810 A | 12/1998 | Muller | |
| 5,879,582 A | 3/1999 | Havelka et al. | |
| 5,891,356 A | 4/1999 | Inoue et al. | |
| 5,904,824 A | 5/1999 | Oh | |
| 5,925,259 A | 7/1999 | Biebuyck et al. | |
| 5,948,470 A | 9/1999 | Harrison et al. | |
| 6,111,323 A | 8/2000 | Carter et al. | |
| 6,143,647 A | 11/2000 | Pan et al. | |

(Continued)

FOREIGN PATENT DOCUMENTS

| CN | 1562730 | 1/2005 |
|---|---|---|
| EP | 0784543 | 4/2000 |

(Continued)

OTHER PUBLICATIONS

Bae, Joonwon, "Surface Modification Using Photo-Crosslinkable Random Copolymers", Abstract submitted for the Mar. 2006 meeting of the American Physical Society, submitted Nov. 30, 2005.

(Continued)

*Primary Examiner* — Anita K Alanko
(74) *Attorney, Agent, or Firm* — TraskBritt

(57) ABSTRACT

Methods for fabricating sublithographic, nanoscale microstructures arrays including openings and linear microchannels utilizing self-assembling block copolymers, and films and devices formed from these methods are provided. In some embodiments, the films can be used as a template or mask to etch openings in an underlying material layer.

22 Claims, 18 Drawing Sheets

U.S. PATENT DOCUMENTS

| | | |
|---|---|---|
| 6,270,946 B1 | 8/2001 | Miller |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,423,465 B1 | 7/2002 | Hawker et al. |
| 6,503,841 B1 | 1/2003 | Criscuolo |
| 6,506,660 B2 | 1/2003 | Holmes et al. |
| 6,548,830 B1 | 4/2003 | Noguchi et al. |
| 6,565,763 B1 | 5/2003 | Asakawa |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross et al. |
| 6,884,842 B2 | 4/2005 | Soane et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,913,697 B2 | 7/2005 | Lopez et al. |
| 6,924,341 B2 | 8/2005 | Mays |
| 6,926,953 B2 | 8/2005 | Nealey et al. |
| 6,946,332 B2 | 9/2005 | Loo et al. |
| 6,949,456 B2 | 9/2005 | Kumar |
| 6,957,608 B1 | 10/2005 | Hubert et al. |
| 6,962,823 B2 | 11/2005 | Empedocles et al. |
| 6,989,426 B2 | 1/2006 | Hu et al. |
| 6,992,115 B2 | 1/2006 | Hawker et al. |
| 6,998,152 B2 | 2/2006 | Uhlenbrock |
| 7,030,495 B2 | 4/2006 | Colburn et al. |
| 7,037,744 B2 | 5/2006 | Colburn et al. |
| 7,045,851 B2 | 5/2006 | Black et al. |
| 7,056,455 B2 | 6/2006 | Matyjasewski et al. |
| 7,056,849 B2 | 6/2006 | Wan et al. |
| 7,077,992 B2 | 7/2006 | Sreenivasan et al. |
| 7,090,784 B2 | 8/2006 | Asakawa et al. |
| 7,115,525 B2 | 10/2006 | Abatchev et al. |
| 7,115,995 B2 | 10/2006 | Wong |
| 7,118,784 B1 | 10/2006 | Xie |
| 7,132,370 B2 | 11/2006 | Paraschiv |
| 7,135,144 B2 | 11/2006 | Christel et al. |
| 7,135,388 B2 | 11/2006 | Ryu et al. |
| 7,135,523 B2 | 11/2006 | Ho et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,202,308 B2 | 4/2007 | Boussand et al. |
| 7,252,791 B2 | 8/2007 | Wasserscheid et al. |
| 7,259,101 B2 | 8/2007 | Zurcher et al. |
| 7,282,240 B1 | 10/2007 | Jackman et al. |
| 7,291,284 B2 | 11/2007 | Mirkin et al. |
| 7,326,514 B2 | 2/2008 | Dai et al. |
| 7,332,627 B2 | 2/2008 | Chandross et al. |
| 7,347,953 B2 * | 3/2008 | Black et al. ............ 216/83 |
| 7,407,887 B2 | 8/2008 | Guo |
| 7,408,186 B2 | 8/2008 | Merkulov et al. |
| 7,514,339 B2 | 4/2009 | Yang et al. |
| 7,521,090 B1 * | 4/2009 | Cheng et al. ............ 427/256 |
| 7,553,760 B2 | 6/2009 | Yang et al. |
| 7,592,247 B2 | 9/2009 | Yang et al. |
| 7,605,081 B2 | 10/2009 | Yang et al. |
| 7,767,099 B2 | 8/2010 | Li et al. |
| 2002/0055239 A1 | 5/2002 | Tuominen et al. |
| 2002/0158342 A1 | 10/2002 | Tuominen et al. |
| 2003/0077452 A1 | 4/2003 | Guire et al. |
| 2003/0091752 A1 | 5/2003 | Nealey et al. |
| 2003/0100822 A1 | 5/2003 | Lew et al. |
| 2003/0143375 A1 | 7/2003 | Noguchi et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski |
| 2003/0235930 A1 | 12/2003 | Bao et al. |
| 2004/0028875 A1 | 2/2004 | Van Rijn et al. |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn |
| 2004/0142578 A1 | 7/2004 | Wiesner et al. |
| 2004/0159633 A1 | 8/2004 | Whitesides et al. |
| 2004/0175628 A1 | 9/2004 | Nealey et al. |
| 2004/0192013 A1 | 9/2004 | Ryu et al. |
| 2004/0222415 A1 | 11/2004 | Chou |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol |
| 2005/0100830 A1 | 5/2005 | Xu et al. |
| 2005/0124135 A1 | 6/2005 | Ayazi et al. |
| 2005/0147841 A1 | 7/2005 | Tavkhelidze et al. |
| 2005/0167651 A1 | 8/2005 | Merkulov et al. |
| 2005/0208752 A1 | 9/2005 | Colburn et al. |
| 2005/0238889 A1 | 10/2005 | Iwamoto |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0038182 A1 | 2/2006 | Rogers et al. |
| 2006/0046079 A1 | 3/2006 | Lee |
| 2006/0046480 A1 | 3/2006 | Guo |
| 2006/0060863 A1 | 3/2006 | Lu et al. |
| 2006/0062867 A1 | 3/2006 | Choi |
| 2006/0078681 A1 | 4/2006 | Hieda et al. |
| 2006/0105562 A1 | 5/2006 | Yi |
| 2006/0124467 A1 | 6/2006 | Ho et al. |
| 2006/0134556 A1 | 6/2006 | Nealey et al. |
| 2006/0163646 A1 | 7/2006 | Black |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze et al. |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells |
| 2007/0045562 A1 | 3/2007 | Parekh |
| 2007/0071881 A1 | 3/2007 | Chua et al. |
| 2007/0072403 A1 | 3/2007 | Sakata |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |

| | | | |
|---|---|---|---|
| 2007/0224819 A1 | 9/2007 | Sandhu | |
| 2007/0227383 A1 | 10/2007 | Decre et al. | |
| 2007/0249117 A1 | 10/2007 | Kang et al. | |
| 2007/0281220 A1 | 12/2007 | Sandhu et al. | |
| 2007/0289943 A1 | 12/2007 | Lu et al. | |
| 2007/0293041 A1 | 12/2007 | Yang et al. | |
| 2008/0083991 A1 | 4/2008 | Yang et al. | |
| 2008/0093743 A1 | 4/2008 | Yang et al. | |
| 2008/0103256 A1 | 5/2008 | Kim et al. | |
| 2008/0164558 A1 | 7/2008 | Yang et al. | |
| 2008/0176767 A1 | 7/2008 | Millward | |
| 2008/0193658 A1 | 8/2008 | Millward | |
| 2008/0217292 A1 | 9/2008 | Millward et al. | |
| 2008/0233323 A1* | 9/2008 | Cheng et al. | 428/36.91 |
| 2008/0257187 A1 | 10/2008 | Millward | |
| 2008/0260941 A1 | 10/2008 | Jin | |
| 2008/0274413 A1 | 11/2008 | Millward | |
| 2008/0286659 A1 | 11/2008 | Millward | |
| 2008/0315270 A1 | 12/2008 | Marsh et al. | |
| 2008/0318005 A1 | 12/2008 | Millward | |
| 2009/0062470 A1 | 3/2009 | Millward et al. | |
| 2009/0200646 A1 | 8/2009 | Millward et al. | |
| 2009/0206489 A1 | 8/2009 | Li et al. | |
| 2009/0236309 A1 | 9/2009 | Millward et al. | |
| 2009/0240001 A1 | 9/2009 | Regner | |
| 2009/0263628 A1 | 10/2009 | Millward | |
| 2009/0274887 A1 | 11/2009 | Millward et al. | |
| 2010/0092873 A1 | 4/2010 | Sills et al. | |
| 2010/0102415 A1 | 4/2010 | Millward et al. | |
| 2010/0124826 A1 | 5/2010 | Millward et al. | |
| 2010/0137496 A1 | 6/2010 | Millward et al. | |
| 2010/0163180 A1 | 7/2010 | Millward | |
| 2010/0204402 A1 | 8/2010 | Millward et al. | |
| 2010/0279062 A1 | 11/2010 | Millward | |
| 2010/0316849 A1* | 12/2010 | Millward et al. | 428/195.1 |
| 2010/0323096 A1 | 12/2010 | Sills et al. | |

FOREIGN PATENT DOCUMENTS

| | | |
|---|---|---|
| EP | 1416303 A2 | 5/2004 |
| EP | 1593164 B1 | 6/2010 |
| JP | 11080414 | 3/1999 |
| JP | 2005008882 | 1/2005 |
| JP | 2006036923 | 2/2005 |
| JP | 2006055982 | 3/2006 |
| JP | 2008-036491 A | 2/2008 |
| TW | 200400990 A | 1/2004 |
| TW | 200419017 | 10/2004 |
| TW | 200511364 | 3/2005 |
| TW | I253456 | 4/2006 |
| TW | 256110 | 6/2006 |
| WO | 9007575 | 7/1990 |
| WO | 97/06013 | 2/1997 |
| WO | 98/39645 | 9/1998 |
| WO | 99/47570 | 9/1999 |
| WO | 0031183 A1 | 6/2000 |
| WO | 02081372 | 10/2002 |
| WO | 2005/122285 A2 | 12/2005 |
| WO | 2006/076016 | 7/2006 |
| WO | 2006/078952 | 7/2006 |
| WO | 2007/001294 A1 | 1/2007 |
| WO | 2007/019439 A3 | 2/2007 |
| WO | 2007013889 | 2/2007 |
| WO | 2007/024241 | 3/2007 |
| WO | 2007/024323 A2 | 3/2007 |
| WO | 2007/055041 | 5/2007 |
| WO | 2008/091741 A2 | 7/2008 |
| WO | 2008/097736 A2 | 8/2008 |
| WO | 2008096335 A2 | 8/2008 |
| WO | 2008/124219 A2 | 10/2008 |
| WO | 2008118635 A2 | 10/2008 |
| WO | 2008130847 A1 | 10/2008 |
| WO | 2008145268 A1 | 12/2008 |
| WO | 2008156977 A2 | 12/2008 |
| WO | 2009099924 A2 | 8/2009 |
| WO | 2009102551 A2 | 8/2009 |
| WO | 2009117238 A2 | 9/2009 |
| WO | 2009117243 A1 | 9/2009 |
| WO | 2009134635 A2 | 11/2009 |

OTHER PUBLICATIONS

Bang, Joona, "The Effect of Humidity on the Ordering of Tri-block Copolymer Thin Films," Abstract submitted for the Mar. 2007 meeting of the American Physical Society, submitted Nov. 20, 2006.
Bass, Robert B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.
Bearinger, J.P., et al., Nature Materials 2, 259-264, 2003, published online Mar. 23, 2003.
Black, C.T., IEEE 2005 Custom Integrated Circuits Conference, pp. 87-91.
Black, C.T., et al., IBM J. Res. & Dev., vol. 51, No. 5, Sep. 2007, pp. 605-633.
Black, Charles T., ACSNano, vol. 1, No. 3, 2007, American Chemical Society, pp. 147-150, published online Oct. 31, 2007.
Black, Charles T., et al., IEEE Electronon Device Letters, vol. 25, No. 9, Sep. 2004, pp. 622-624.
Botelho do Rego, A.M., et al., Surface Science, 482-485 (2001), pp. 1228-1234.
Brydson, Rik M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/Summary).
Canaria, Christi A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).
Chandekar, Amol, et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).
Cheng, Joy T., et al., Nano Letters, vol. 0, No. 0, A-E, published on Web Aug. 16, 2006.
Daoulas Kostas Ch., et al., Physical Review Letters 96, week ending Jan. 27, 2006, pp. 036104-1-3.
Desai, Dr. Trejal A., et al., Business Briefing: Medical Device Manufacturing & Technology, 2002.
Edwards, Erik W., et al., Journal of Polymer Science: Part B Polymer Physics, vol. 43, 3444-3459, 2005.
Edwards, Erik W., et al., Advanced Mater, 16, No. 15, Aug. 4, 2004, pp. 1315-1319.
Fasolka, Michael J. et al., Macromolecules 2000, vol. 33, No. 15, pp. 5702-5712, published on the web Jun. 29, 2000.
Gates, Byron D., et al., Annu. Rev. Mater. Res. 2004, 34:339-72, published online Mar. 26, 2004.
Ge, Zhenbin, et al., PRL 96, 186101-1-186101-4, The American Physical Society, week ending May 12, 2006.
Genua, A., et al., Nanotechnology, 18 (2007), pp. 1-7, published Apr. 27, 2007.
Gillmor, S.D., et al., Langmuir 2000, vol. 16, No. 18, 2000, pp. 7223-7228, published on Web Aug. 5, 2000.
Hamley, I. W., "Introduction to Block Copolymers", Developments in Block Copolymers Science and Technology, 2004, John Wiley & Sons, Ltd., pp. 1-29.
Hermans, Thomas M., et al., "Application of Solvent-Directed Assembly of Block Copolymers to the Synthesis of Nanostructured Materials with Low Dielectric Constants", Angewandte Chem. Int. Ed. 2006, 45, pp. 6648-6652.
Hutchison, J. Brian, et al., Chem. Mater., vol. 17, No. 19, 2005, pp. 4789-4797, published on Web Aug. 25, 2005.
In, Insik, et al., Langmuir, vol. 22, No. 18, 2006, pp. 7855-7860, published on Web Aug. 1, 2006.
Kim, Sang Ouk, et al., Nature, vol. 424, Jul. 24, 2003, pp. 411-414.
Kim, Sang Ouk, et al., Adv. Mater., 2007, 19, pp. 3271-3275.
Kim, Seung Hyun, et al., Macromolecules 2006, vol. 39, No. 24, 2006, pp. 8473-8479, published on Web Oct. 25, 2006.
Kim, Seung Hyun, et al., Advanced Mater., vol. 16, No. 23-24, pp. 2119-2123, Dec. 17, 2004.
Krishnamoorthy, Sivashankar, et al., MaterialsToday, vol. 9, No. 9, Sep. 2006, pp. 40-47.

La, Young-Hye, et al., Chem. Mater, 2007, vol. 19, No. 18, pp. 4538-4544, published on Web Jul. 28, 2007.
Laracuente, A.R., et al., Surface Science 545, 2003, pp. 70-84.
Lentz, David, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Feb. 2007, pp. 1-10.
Li, Mingqi, et al., MaterialsToday, vol. 9, No. 9, Sep. 2006, pp. 30-39.
Li, Xue, et al., Polymer 48 (2007), pp. 2434-2443, available online Feb. 25, 2007.
Lin, Zhiqun, et al., Adv. Mater. 2002, 14 No. 19, Oct. 2, pp. 1373-1376.
Lin-Gibson, Sheng, et al., Macromolecules 2005, 38, pp. 2897-2902, published on Web Mar. 8, 2005.
Malkoch, Michael, et al., Chem. Commun., 2006, pp. 2774-2776, published on the web Jun. 1, 2006.
Mansky, P., et al., Science, vol. 275, Mar. 7, 1997, pp. 1458-1460.
Maye, Mathew A., et al., Journal of Chemical Education, vol. 79, No. 2, Feb. 2002, pp. 207-210.
Meyer, Evelyn, et al., Macromollecular Mater. Eng., 276/277, 2000, pp. 44-50.
Mezzenga, Raffaele, et al., Langmuir 2003, vol. 19, No. 20, 2003, pp. 8144-8147, published on Web Aug. 29, 2003.
Mindel, Joseph., et.al., "A Study of Bredig Platinum Sols", The Chemical Laboratories of New York University, vol. 65 pp. 2112.
Naito, et al., IEEE Transactions on Magnetics, vol. 38, No. 5, Sep. 2002, pp. 1949-1951.
Nealey, Paul F., et al., "Self-Assembling Resists for Nanolithography", IEEE 2005.
Nguyen, Kytai, et al., Biomaterials 23, 2002, pp. 4307-4314.
Wang, C., et al., Electrochimica Acta 52 (2006), pp. 704-709, available online Jul. 12, 2006.
Black, C.T., Proc. of SPIE, vol. 6153, 615302 (2006).
Darling, S.B., Progress in Polymer Science, vol. 32, No. 10, Sep. 28, 2007, pp. 1152-1204.
Harrison, Christopher et al., Polymer, vol. 39, No. 13, pp. 2733-2744, 1998.
Kim, Su-Jin, et al., J. Vac. Sci. Technol. B26(1), Jan./Feb. 2008, 189-194.
La, Young-Hye, et al., J. Vac. Sci. Technol. B 25(6), Nov./Dec. 2007, pp. 2508-2513.
Olayo-Valles, Roberto et al., J. Mater. Chem, 2004, 14, 2729-2731, published on web Aug. 18, 2004.
Yang, XiaoMin, et al., J. Vac. Sci. Technol. B 22(6), Nov./Dec. 2004, 3331-3334.
Berry, B.C., et al., "Effects of Zone Annealing on Thin Films of Block Copolymers", National Institute of Standard and Technology, Polymers Division, Gaithersburg, MD., 2007.
Black, C.T., Applied Physics Letters 87, 163116-1 to 1163116-3, 2005, published online Oct. 13, 2005.
Black, Charles T., IEEE Transactions on Nanotechnology, vol. 3, No. 3, Sep. 2004, pp. 412-415.
Cavicchi, Kevin A., et al., Macromolecules 2007, vol. 40, 2007, pp. 1181-1186, published on the web Jan. 24, 2007.
Gudipati, Chakravarthy S., et al., Journal of Polymer Science Part A: Polymer Chemistry, vol. 42, pp. 6193-6208.
Guo, Kai, et al., Abstract of "Synthesis and Characterization of Novel Biodegradable Unsaturated Poly(ester amide)/Poly(ethylene glycol) Diacrylate Hydrogels", Journal of Polymer Science Part A: Polymer Chemistry, vol. 43, Issue 17, pp. 3932-3944, 2005 Wiley Periodicals, Inc.
Karim, Alamgir et al., "Control of Ordering Kinetics and Morphology Using Zone Annealing of Thin Block Copolymer Filmes", Abstract submitted for the Mar. 2007 Meeting of The American Physical Society, Nov. 20, 2006.
Kim, Seung Hyun, et al., Adv. Mater. 2004, 16, No. 3, Feb. 3, pp. 226-231.
Park, Dae-Ho, Nanotechnology 18, 2007, 355304, pp. 1-7, Aug. 8, 2007.
Peng, Juan et al., Macromol. Rapid Commun. 2007, 28, 1422-1428.
Rogers, John A., ACS Nano, vol. 1, No. 3, pp. 151-153, 2007.
Rozkiewicz, Dorota I., et al., Angew. Chem. Int. Ed., 2006, 45, pp. 5292-5296.
Ruiz, Ricardo et al., Science, vol. 321, Aug. 15, 2008, pp. 936-939.
Segalman, Rachel A., Materials Science and Engineering R 48 (2005), pp. 191-226.
Srinvivasan, Charan, et al., ACS Nano, vol. 1, No. 3, pp. 191-201, 2007, published online Oct. 17, 2007.
Xiao, Shuaigang et al., Nanotechnology 16 (2005) S324-S329, Apr. 15, 2005.
Jun, et al., Langmuir, 2002, 18(9), pp. 3415-3417, Abstract only, Web publication date Apr. 3, 2002.
Balsara et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.
Bulpitt, Paul et al, Journal of Biomedical Materials Research, vol. 47, Issue 2, pp. 152-169, Abstract only, published online Aug. 13, 1999.
Elisseeff J., et al., Journal of Biomedical Materials Research, 51(2): 164-171, Aug. 2000, Abstract only.
Gelest Inc., Silane Coupling Agents: Connecting Across Boundaries, pp. 1-56, 2006.
Ji, Shengxiang, et al., Preparation of Neutral Wetting Brushes for Block Copolymer Films from Homopolymer Blends, submitted to Advanced Materials, 20(16): 3054-3060; published online Jul. 7, 2008.
Ji, Shengxiang, et al., Macromolecules, 2008, 41(23): 9098-9103.
Kim, SH, J Biomater Appl., Jul. 2000; 15(1): 23-46 Abstract only.
Kim, SH, J Biomater Res., Mar. 15, 2000; 49(4): 517-27 Abstract only.
Kim, IS, et al., Int J Pharm., Sep. 15, 2000; 205(1-2): 109-16, Abstract only.
Li, Wai-kin, et al, J. Vac. Sci. Technol. B 25(6), Nov./Dec. 2007, pp. 1982-1984, published Dec. 6, 2007.
Lutolf, M.P., et al, Nature Biotechnology, 23, 47-55 (2005), Abstract only, published online Jan. 6, 2005.
Martens, P., et al., Polymer, vol. 41, Issue 21, Oct. 2000, pp. 7715-7722, Abstract only.
Matsuda, T., et al., ASAIO J, Jul.-Sep. 1992; 38(3): M154-7, Abstract only.
Sawhney, Amarpreet S., et al., Macromolecules 1993, 26, 581-587, Abstract only.
Walthier, Michel, et al., J. Am. Chem. Soc., 2004, 126 (40), pp. 12744-12745, Abstract only, web publication date Sep. 21, 2004.
Truskett, Van N., et al., Trends in Biotechnology, vol. 24, No. 7, Jul. 2006, pp. 312-315.
Cheng, Joy Y., et al., Nano Letters, vol. 6, No. 9, 2006, pp. 2099-2103, publ on Web Aug. 16, 2006.
Cheng, Joy Y., et al., Adv. Mater. 2003, vol. 15, No. 19, pp. 1599-1602, Oct. 2, 2003.
Cheng, Joy Y., et al., Applied Physics Letters, 91, 143106-143106-3 (2007), publ online Oct. 1, 2007.
Niu, Sanjun, et al., Macromolecules, 36(7), 2428-2440, 2003 (web release date: Mar. 13, 2003) http://digitalcommons.uni.edu/cgi/viewcontent.cgi?article+1005&contect=chemeng_nanotechnology).
Parejo, Pilar Garcia, et al., J. Mater. Chem., 2006, 16, pp. 2165-2169.
Park, Cheolmin, et al., Polymer 44, 2003, 6725-6760.
Park, Miri, et al., Science, v. 276, No. 5317, p. 1401-1404, May 30, 1997.
Park, Sang-Min, et al., Adv. Mater., 2007, 19, pp. 607-611.
Park, Sung Chan, et al., Macromolecules 2007, vol. 40, No. 22, pp. 8119-8124, published on Web Oct. 4, 2007.
Peters, Richard D., et al., J. Vac. Sci. Technol. B, vol. 18, No. 6, Nov./Dec. 2000, pp. 3530-3532.
Peters, Richard D., et al., Macromolecules, vol. 35, No. 5, 2002, pp. 1822-1834, published on Web Jan. 26, 2002.
Potemkin, Igor I., et al., Macromol. Rapid Commun., 2007, 28, pp. 579-584.
Resnick, Douglas, J., et al., J. Microlith., Microfab., Microsyst., vol. 3, No. 2, Apr. 2004, pp. 316-321.
Ruiz, Ricardo, et al., Adv. Mater, 2007, 19, pp. 587-591.
Ryu, Du Yeol, et al., Macromolecules, vol. 40, No. 12, 2007, pp. 4296-4300, published on Web May 19, 2007.

Saraf, Ravi R., et al., Applied Physics Letters, vol. 80, No. 23, Jun. 10, 2002, pp. 4425-4427.
Shahrjerdi, Davood, et al., IEEE Electron Device Letters, vol. 28, No. 9, Sep. 2007, pp. 793-796.
Sharma, Sadhana, et al., Applied Surface Science, 206 (2003), pp. 218-229.
Sivaniah, E., et al., Macromolecules 2003, 36, pp. 5894-5896, publ on Web Jul. 15, 2003.
Sivaniah, et al., Macromolecules 2005, 38, 1837-1849, publ on Web Feb. 2, 2005.
Solak, Harun H., Journal of Physics D: Applied Physics, 2006, pp. R171-188, published May 5, 2006.
Stoykovich, Mark P., et al., Science, vol. 308, Jun. 3, 2005, pp. 1442-1446.
Stoykovich, Mark P., et al., ACS Nano, vol. 1, No. 3, 2007, pp. 168-175, published online Oct. 6, 2007.
Sundrani, Deepak, et al., Nano Lett., vol. 4, No. 2, 2004, pp. 273-276, published on Web Dec. 25, 2003.
Sundrani, Deepak, et al., Langmuir 2004, vol. 20, No. 12, 2004, pp. 5091-5099, published on Web Mar. 11, 2004.
Sigma-Aldrich, Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Van Poll, Maaike L., et al., Angew. Chem. Int. Ed. 2007, 46, pp. 6634-6637.
Winesett, D.A., et al., Langmuir 2003, 19, pp. 8526-8535, published on Web Aug. 22, 2003.
Xu, Ting et al., Polymer 42, (2001) 9091-9095.
Wu, C.Y., et al., IEEE, 2007, pp. 153-154.
Yamaguchi, Toru, et al., Journal of Photopolymer Science and Technology, vol. 19, No. 3, 2006, pp. 385-388.
Yan, Xiaohu, et al., J. Am. Chem. Soc., vol. 126, No. 32, 2004, pp. 10059-10066.
Yang, Xiao M., et al., Macromolecules 2000, vol. 33, No. 26, 2000, pp. 9575-9582, published on Web Dec. 26, 2000.
Yurt, Serkan, et al., Macromolecules 2006, vol. 39, No. 5, 2006, published on Web Feb. 2, 2006.
Zhang, Mingfu, et al., Adv. Mater. 2007, 19, pp. 1571-1576, published online May 15, 2007.
Arshady et al., Makromol. Chem., 1976, vol. 177, p. 2911-2918.
Bang, J. Abstract submitted for the Mar. 2006 meeting of the American Physical Society, submitted Nov. 2005 [online], accessed via the Internet [retrieved on Apr. 5, 2010], URL: <http://absimage.aps.org/image/MWS_MAR06-2005-003641.pdf>.
Candau et al., Polymer, 1977, vol. 18, p. 1253-1257.
Hawker et al., Facile Synthesis of Block Copolymers for Nanolithographic Applications; Polymer Reprints, 2005.
Nishikubo, T., American Chemical Society Symposium Series, 1997, p. 214-230.
He, Yiyong et al., J. Am. Chem. Soc. 2006, 128, pp. 2745-2750, web publication Feb. 2, 2006.
Ali, H.A., et al., Solid-State Electronics 46 (2002), 1639-1642.

Berry et al., Orientational Order in Block Copolymer Films Zone Annealed below the Order-Disorder Transition Temperature , Nano Letters vol. 7, No. 9 Aug. 2007, p. 2789-2794.
Hammond et al., Temperature Dependence of Order, Disorder, and Defects in Laterally Confined Diblock Copolymer Cylinder Monolayers, Macromolecules vol. 38, Jul. 2005; p. 6575-6585.
Knoll et al., Phase Behavior in Thin Films of Cylinder-Forming Block Copolymers, Physical Review Letters vol. 89, No. 3 Jul. 2002.
Zehner, Robert W. et al., Langmuir, vol. 14, No. 2, pp. 241-244, Jan. 20, 1998.
Berry et al., Orientational Order in Bloack Copolymer Films Zone Annealed below the Order-Disorder Transition Temperature, Nano Letters vol. 7, No. 9 Aug. 2007, p. 2789-2794.
Fukunaga et al., Self-Assembly of Block Copolymer Thin Films Having a Half-Domain-Spacing Thickness: Nonequilibrium Pathways to Achieve Equilibrium Brush Layers Parallel to Substrate, Macromolecules vol. 39, Aug. 2006, p. 6171-6179.
Hammond et al., Temperature Dependence of Order, Disorder, and Defects in Laterally Confined Diblock Copolymer Cylinder Monolayers, Macromoleculars vol. 38, Jul. 2005; p. 6575-6585.
Knoll et al., Phase Behavoir in Thin Films of Cylinder-Forming Block Copolymers, Physical Review Letters vol. 89, No. 3, Jul. 2002.
Wipf, Handbook of Reagents for Organic Synthesis, 2005, John Wiley & Sons Ltd., p. 320.
Cha, Jennifer N., et al., Chem. Mater. 2007, 19, 839-843, published on web Jan. 20, 2007.
Chang, Li-Wen, Proc. Of SPIE, vol. 6156, 2006, 615611-1 to 615611-6.
Chang, Li-Wen, IEEE Internation Electron Devices Meeting (IEDM), paper 33.2, Dec. 6-8, San Francisco, 2010, pp. 33.2.1-33.2.4.
Ji, Shengxiang et al., ACS Nano, vol. 4, No. 2, 2010, pp. 599-609, published online Dec. 30, 2009.
Metters, Andrew, et al., Biomacromolecules 2005, 6, pp. 290-301, 2005, published on web Nov. 13, 2004.
Park, Scung Hak, et al., Soft Matter, 2010, 6, 2010, 120-125, published on web Sep. 17, 2009.
Yamaguchi, Toru, et al., Microprocesses and Nanotechnology, 2007, Conference date Nov. 5-8, 2007, pp. 434-435.
Zhang, Yuan et al., Applied Physics Letter, 91, 013104, 2007, pp. 013104 to 013104-3, published online Jul. 2, 2007.
Ikeda, Susumu et al., NanotechJapan Bulletin—vol. 3, No. 3, Dec. 17, 2010/Focus 26-06.
Choi, et al., IEEE Transactions on Magnetics 41(10):3448-3450 (2005), Oct. 2005.
Hawker et al., "Improving the manufacturability and structural control of block copolymer lithography," Abstracts of Papers, 232nd ACS National Meeting, San Francisco, CA, Sep. 10-14, 2006.
A. Helmbold, D. Meissner, Thin Solid Films, 1996, 283:196-203.
Lutolf et al., Adv. Mater., 2003, 15(11), 888-892, Jun. 5, 2003.
Search Report of the IPO, Taiwanese Application No. 097110156, issued Apr. 10, 2012, two pages.
Zhu et al., Langmuir, 1b, 6766-6722, published on web Jul. 29, 2000.

* cited by examiner

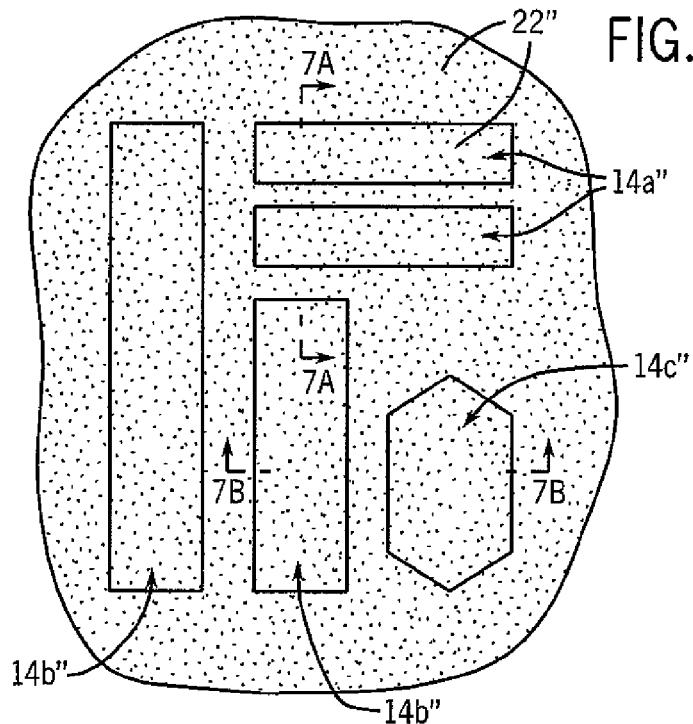
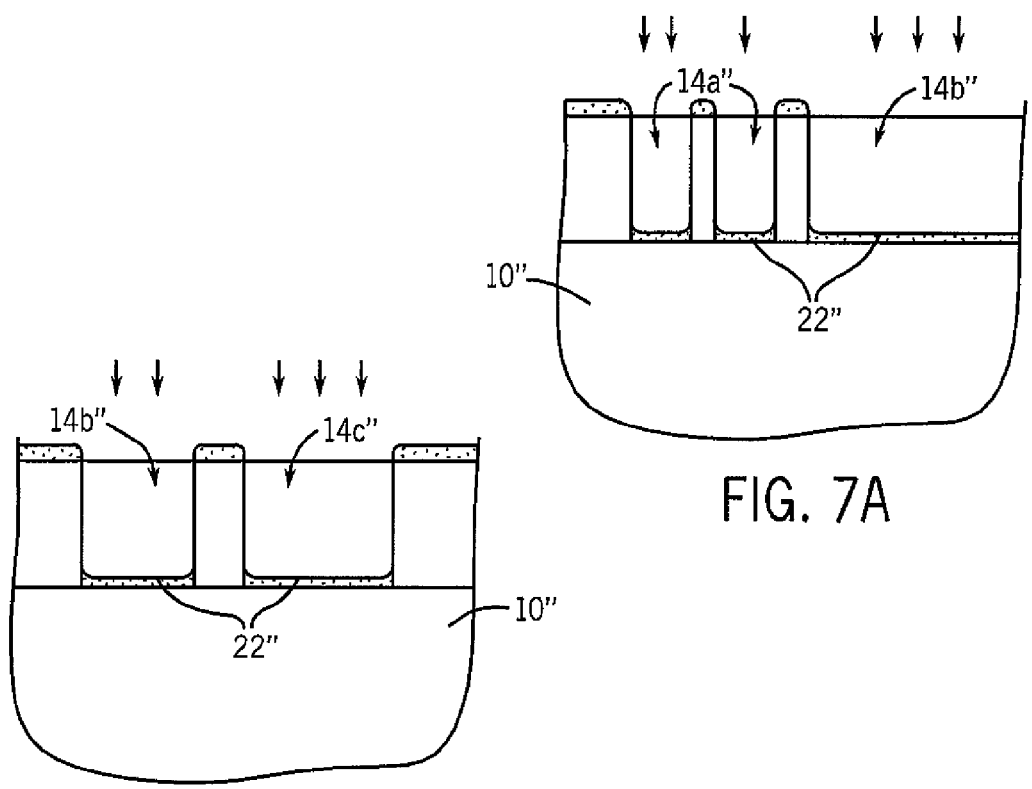
FIG. 7
FIG. 7A
FIG. 7B

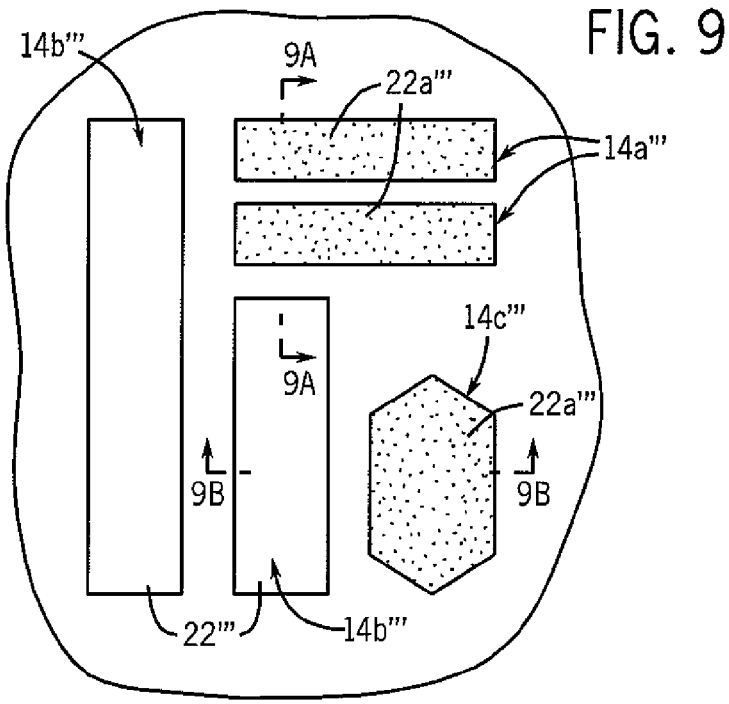
FIG. 9
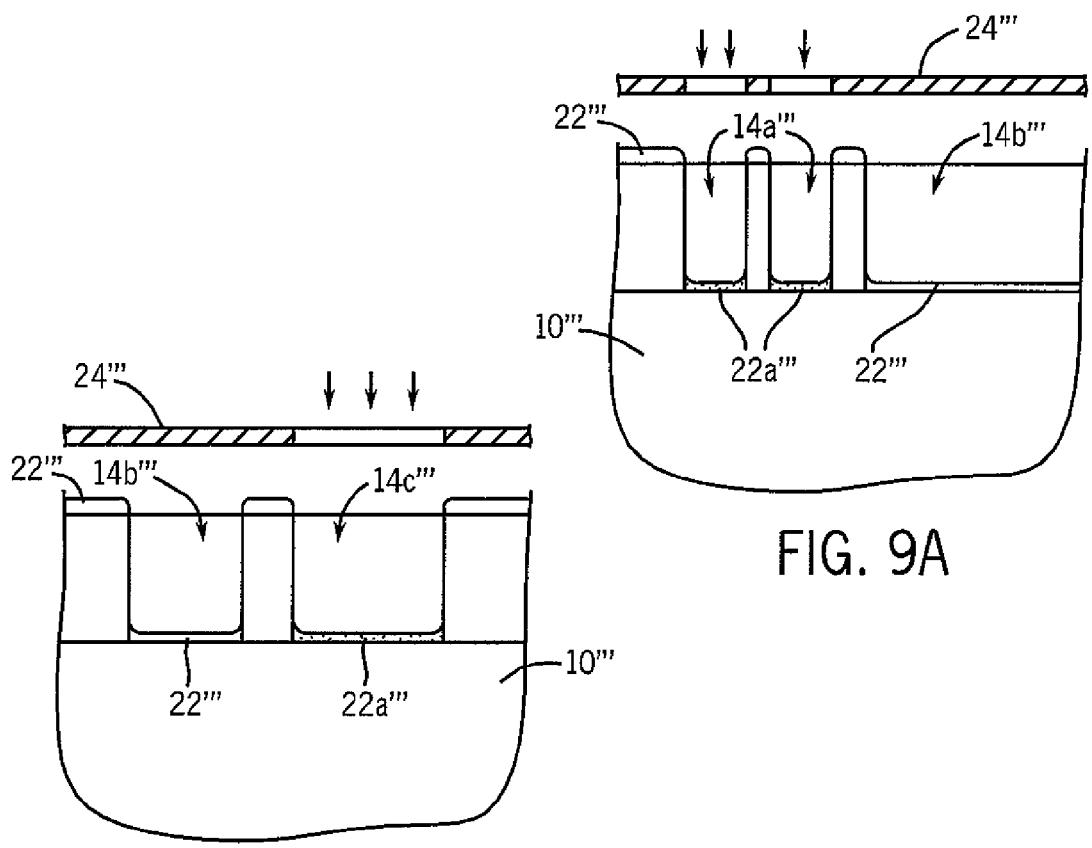
FIG. 9A
FIG. 9B

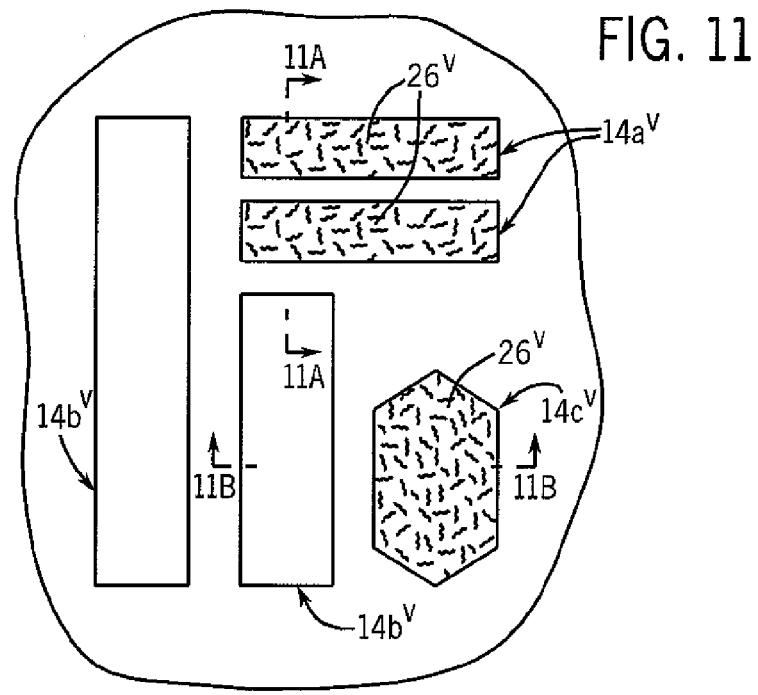
FIG. 11
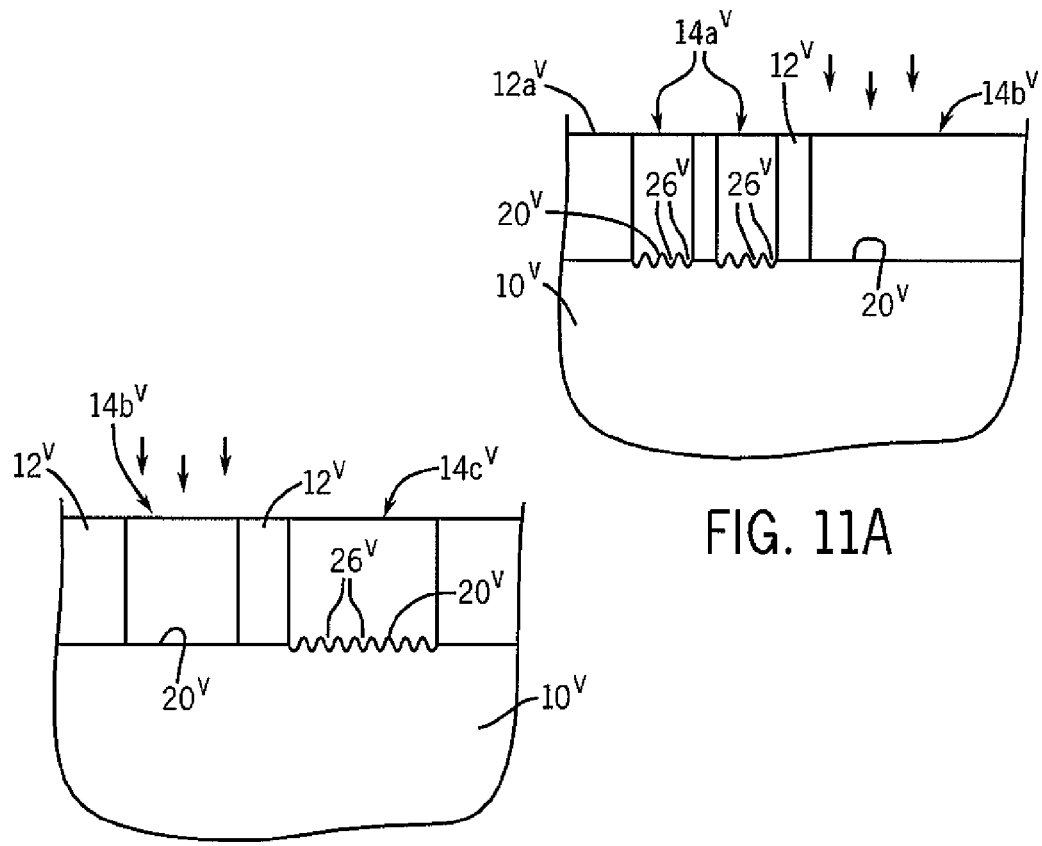
FIG. 11A
FIG. 11B

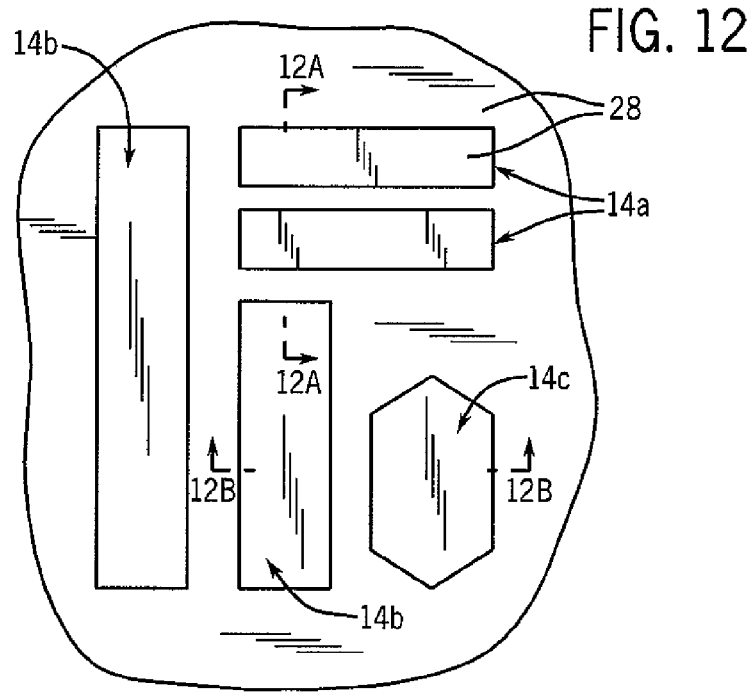
FIG. 12
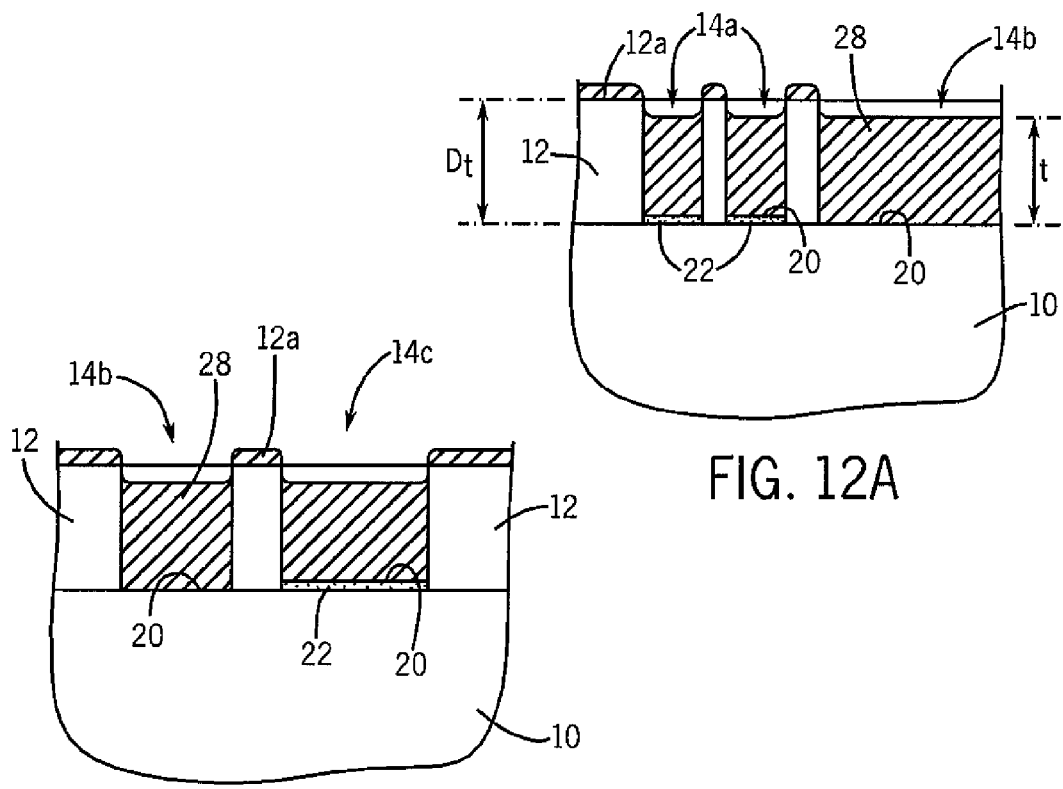
FIG. 12A
FIG. 12B

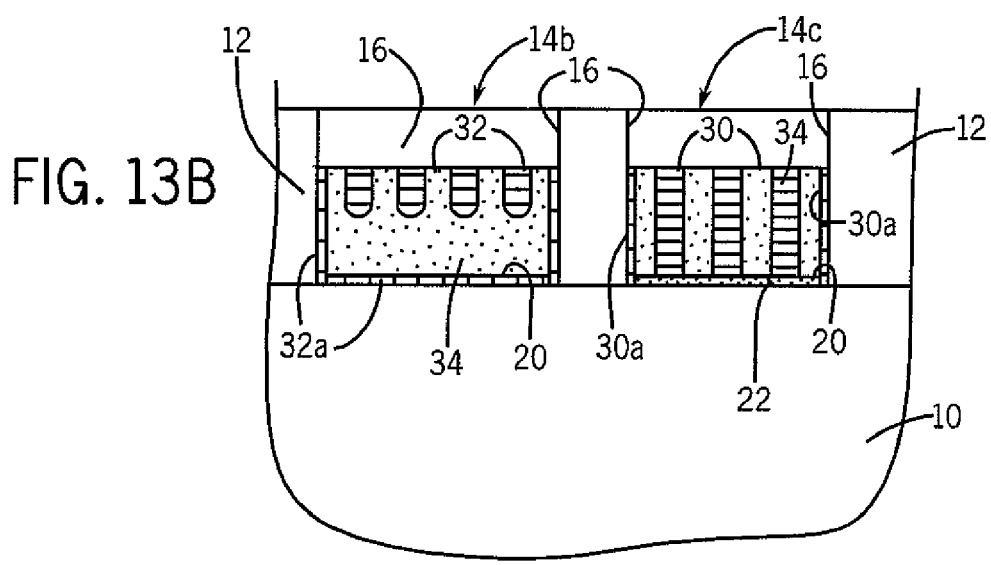
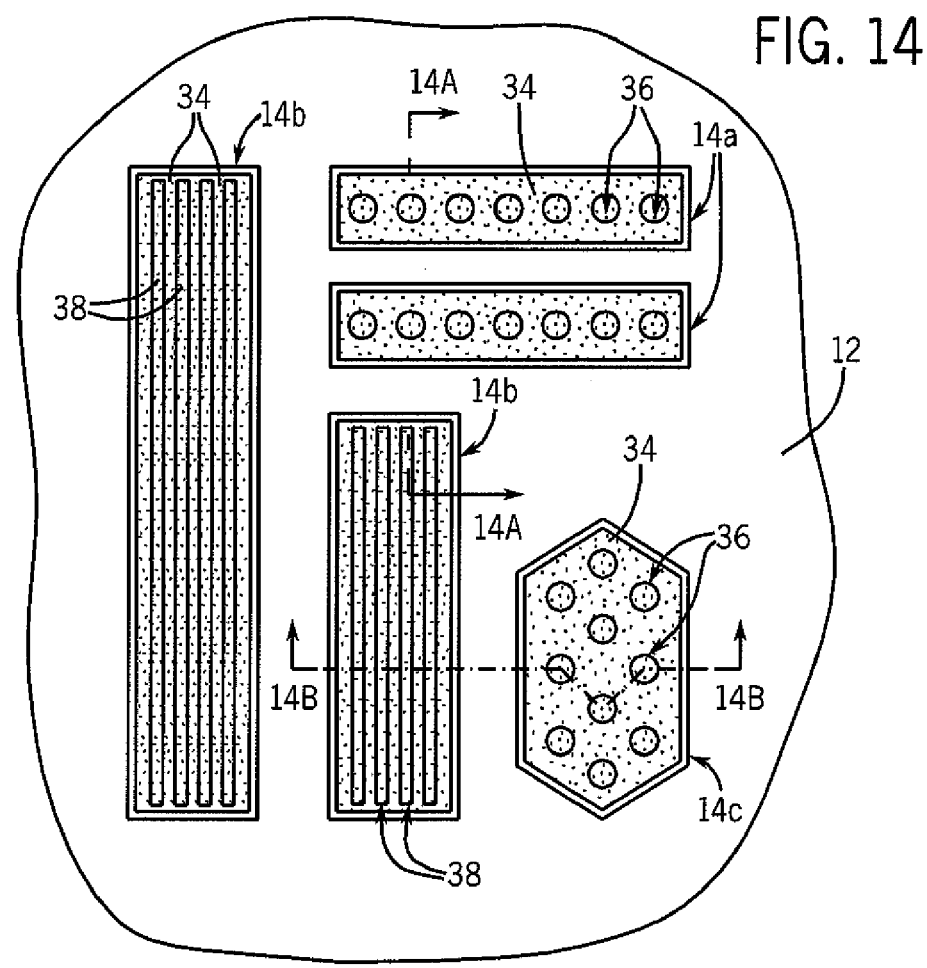

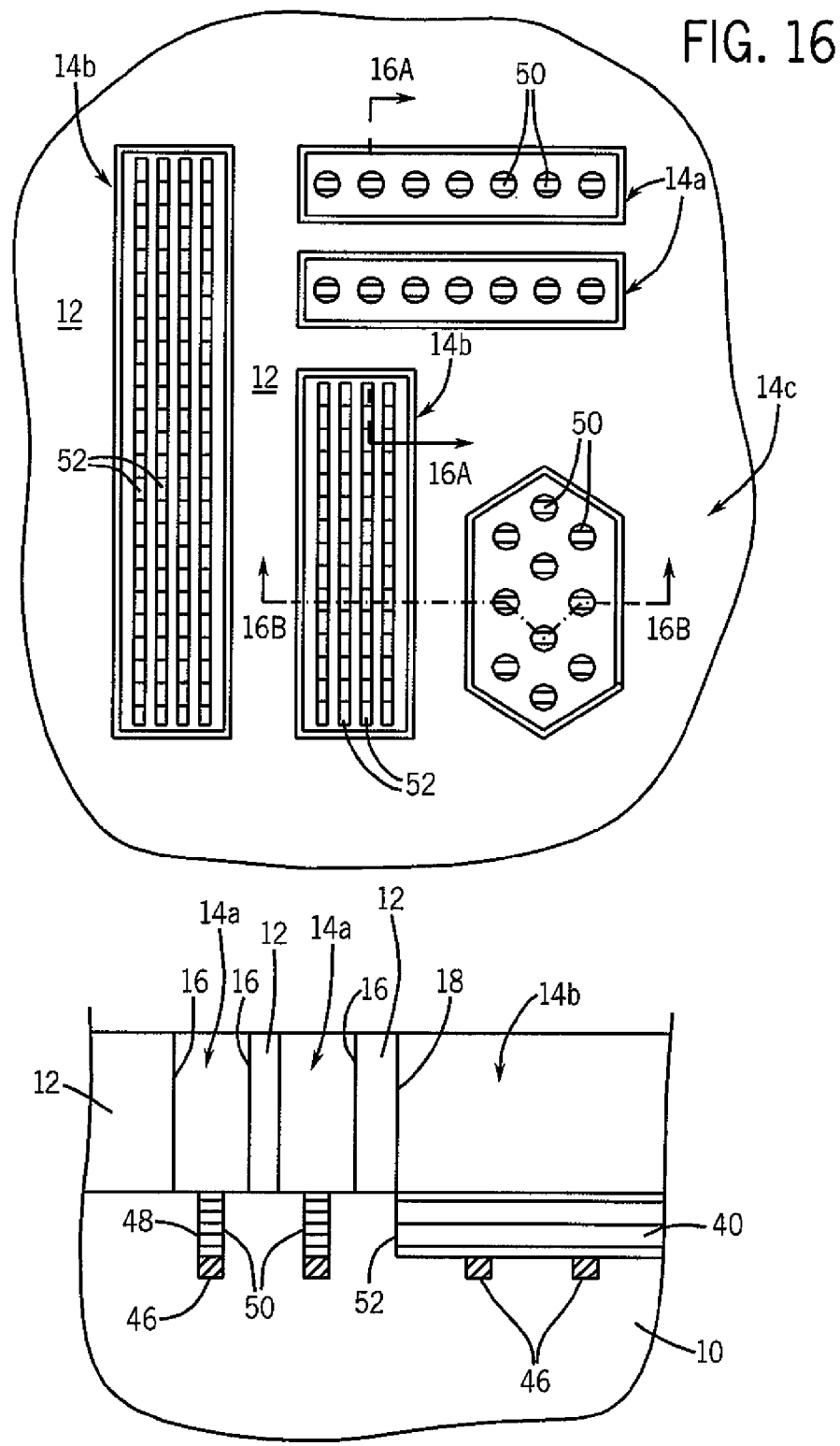

ALTERNATING SELF-ASSEMBLING MORPHOLOGIES OF DIBLOCK COPOLYMERS CONTROLLED BY VARIATIONS IN SURFACES

TECHNICAL FIELD

Embodiments of the invention relate to methods of fabricating nanostructures by use of thin films of self-assembling block copolymers, and devices resulting from those methods.

BACKGROUND OF THE INVENTION

As the development of nanoscale mechanical, electrical, chemical and biological devices and systems increases, new processes and materials are needed to fabricate nanoscale devices and components. Optical lithographic processing methods are not able to accommodate fabrication of structures and features at the nanometer level. The use of self-assembling diblock copolymers presents another route to patterning at nanometer dimensions. Diblock copolymer films spontaneously assembly into periodic structures by microphase separation of the constituent polymer blocks after annealing, for example, by thermal annealing above the glass transition temperature of the polymer or by solvent annealing, forming ordered domains at nanometer-scale dimensions. Following self-assembly, one block of the copolymer can be selectively removed and the remaining patterned film used, for example, as an etch mask for patterning nanosized features into the underlying substrate. Since the domain sizes and periods ($L_o$) involved in this method are determined by the chain length of a block copolymer (MW), resolution can exceed other techniques such as conventional photolithography, while the cost of the technique is far less than electron beam (E-beam) lithography or EUV photolithography, which have comparable resolution.

The film morphology, including the size and shape of the microphase-separated domains, can be controlled by the molecular weight and volume fraction of the AB blocks of a diblock copolymer to produce lamellar, cylindrical, or spherical morphologies, among others. For example, for volume fractions at ratios greater than about 80:20 of the two blocks (AB) of a diblock polymer, a block copolymer film will microphase separate and self-assemble into a periodic spherical domains with spheres of polymer B surrounded by a matrix of polymer A. For ratios of the two blocks between about 60:40 and 80:20, the diblock copolymer assembles into periodic cylindrical domains of polymer B within a matrix of polymer A. For ratios between about 50:50 and 60:40, lamellar domains or alternating stripes of the blocks are formed. Domain size typically ranges from 5-50 nm.

Researchers have demonstrated the ability to chemically differentiate a surface such that some areas are preferentially wetting to one domain of a block copolymer and other areas are neutral wetting to both blocks. Periodic cylindrical structures have been grown in parallel and perpendicular orientations to substrates within trenches by thermal annealing cylindrical-phase block copolymers. A primary requirement for producing perpendicular cylinders is that the trench floor must be non-preferential or neutral wetting to both blocks of the copolymer. For producing parallel-oriented half-cylinders, the trench floor must by preferentially wetting by the minor copolymer block.

A film composed of periodic hexagonal close-packed cylinders, for example, can be useful in forming an etch mask to make structures in an underlying substrate for specific applications such as magnetic storage devices. However, many applications require a more complex layout of elements for forming contacts, conductive lines and/or other elements such as DRAM capacitors.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 2A-3A illustrate elevational, cross-sectional views of a portion of the substrate depicted in FIGS. 2-3 taken, respectively, along lines 2A-2A and 3A-3A. FIGS. 2B-3B illustrate elevational, cross-sectional views of another portion of the substrate depicted in FIGS. 2-3 taken, respectively, along lines 2B-2B and 3B-3B.

FIGS. 5A-6A are elevational, cross-sectional views of a portion of the substrates depicted in FIGS. 5-6, respectively, taken along lines 5A-5A and 6A-6A. FIGS. 5B-6B are elevational, cross-sectional views of another portion of the substrate depicted in FIGS. 5-6, respectively, taken along lines 5B-5B and 6B-6B.

FIGS. 7-8 are diagrammatic top plan views of the substrate of FIG. 2 at subsequent processing steps according to another embodiment of the invention. FIGS. 7A-8A illustrate elevational, cross-sectional views of a portion of the substrate depicted in FIGS. 7-8 taken, respectively, along lines 7A-7A and 8A-8A. FIGS. 7B-8B are elevational, cross-sectional views of a portion of the substrate depicted in FIGS. 7-8 taken, respectively, along lines 7B-7B and 8B-8B.

FIG. 9 is a diagrammatic top plan view of the substrate of FIG. 2 at a subsequent processing step according to another embodiment of the invention to form preferential and neutral wetting surfaces. FIGS. 9A-9B illustrate elevational, cross-sectional views of a portion of the substrate depicted in FIG. 9 taken, respectively, along lines 9A-9A and 9B-9B.

FIG. 11 is a diagrammatic top plan view of the substrate of FIG. 2 at a subsequent processing step according to another embodiment of the invention to form roughened trench floors for a preferential wetting surface. FIGS. 11A-11B illustrate elevational, cross-sectional views of a portion of the substrate depicted in FIG. 11 taken, respectively, along lines 11A-11A and 11B-11B.

FIGS. 12-13 are diagrammatic top plan views of the substrate of FIG. 3 at subsequent stages in the fabrication of a film composed of arrays of cylindrical domains according to an embodiment of the present disclosure FIGS. 14 and 16 are top plan views of the substrate of FIG. 13 at subsequent processing steps according to an embodiment of the invention to form a mask and arrays of conductive contacts and lines in a substrate.

FIGS. 12A-14A and 16A are elevational, cross-sectional views of a portion of the substrate depicted in FIGS. 12-14 and 16 taken, respectively, along lines 12A-12A to 14A-14A and 16A-16A. FIGS. 12B-14B and 16B are elevational, cross-sectional views of a portion of the substrate depicted in FIGS. 12-14 and 16 taken, respectively, along lines 12B-12B to 14B-14B and 16B-16B.

DETAILED DESCRIPTION OF THE INVENTION

Figure 1:
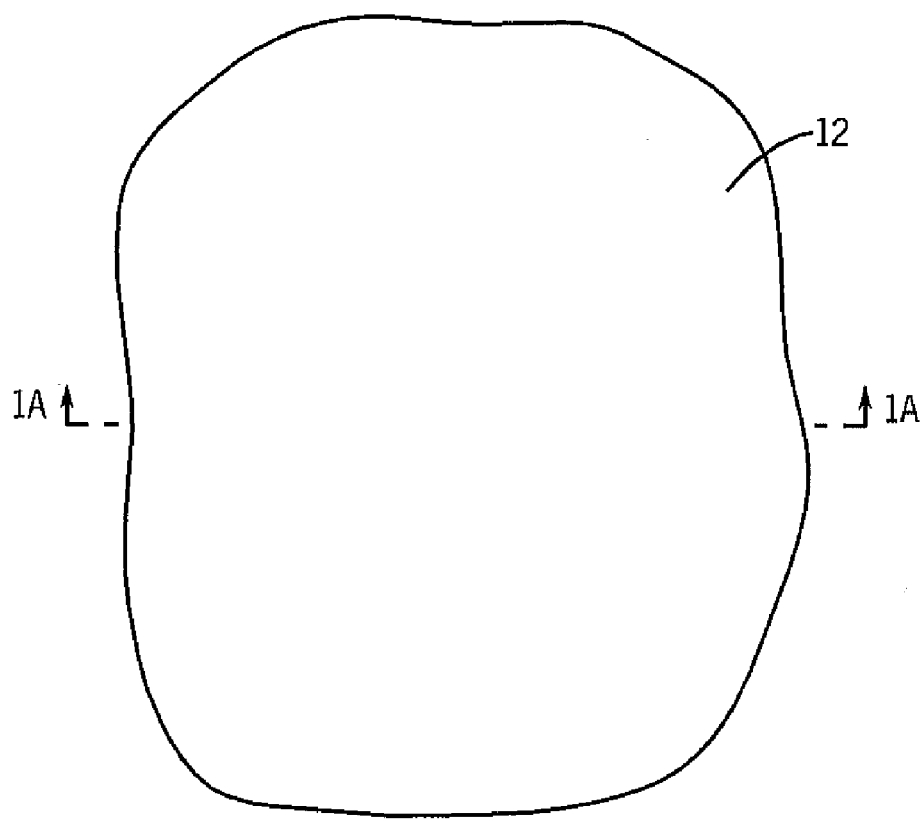
FIG. 1 illustrates a diagrammatic top plan view of a portion of a substrate at a preliminary processing stage according to an embodiment of the present disclosure.

The following description with reference to the drawings provides illustrative examples of devices and methods according to embodiments of the invention. Such description is for illustrative purposes only and not for purposes of limiting the same.

In the context of the current application, the term "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

"$L_o$" is the inherent pitch (bulk period or repeat unit) of structures that self-assemble upon annealing from a self-assembling (SA) block copolymer or a blend of a block copolymer with one or more of its constituent homopolymers.

In embodiments of the invention, processing conditions utilize graphoepitaxy techniques that use topographical features, e.g., the sidewalls and ends of trenches, as constraints to induce the formation and registration of polymer domains of cylindrical-phase diblock copolymers in one dimension (e.g., hexagonal close-packed (honeycomb) array or single row of perpendicular cylinders) and chemically or structurally (topographically) differentiated trench floors to provide a wetting pattern to control orientation of the microphase separated and self-assembling cylindrical domains in a second dimension (e.g., parallel lines of half-cylinders or perpendicular-oriented cylinders). The trench floors are structured or composed of surface materials to provide a neutral wetting surface or preferential wetting surface to impose ordering on a block copolymer film that is then cast on top of the substrate and annealed to produce desired arrays of nanoscale cylinders.

Embodiments of the invention provide a means of generating self-assembled diblock copolymer structures wherein perpendicular cylinders are formed in some trenches and parallel-oriented half-cylinders are formed in other trenches. Control of the orientation of the cylinders is provided by the nature of the trench floor surface. Graphoepitaxy is used to provide parallel lines of half-cylinders, hexagonal close-packed arrays of perpendicular cylinders, or a single row of perpendicular cylinders within lithographically defined trenches. A desired pattern of cylinders on a substrate, e.g., a wafer, can be prepared by providing trenches having walls that are selective to one polymer block of a block copolymer and a floor composed either of a material that is block-sensitive or preferentially wetting to one of the blocks of the block copolymer in trenches where lines of parallel half-cylinders are desired, or a material that is neutral wetting to both blocks in trenches where an array of perpendicular cylinders are desired. Embodiments of the invention can be used to pattern lines and openings (holes) in the same patterning step at predetermined locations on a substrate.

Figure 1A:
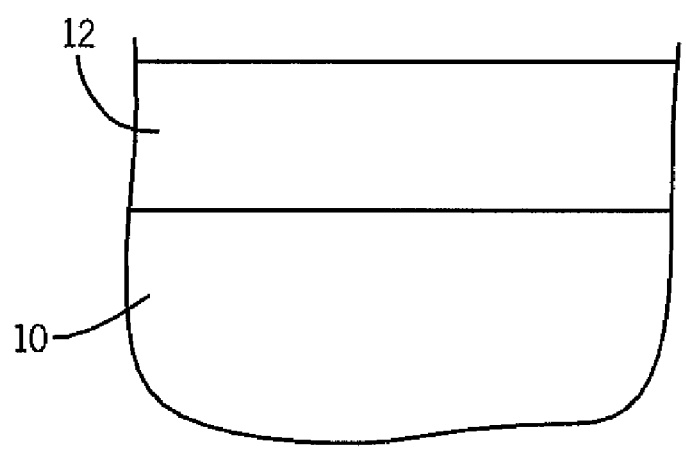
FIG. 1A is an elevational, cross-sectional view of the substrate depicted in FIG. 1 taken along line 1A-1A.
Figure 2:
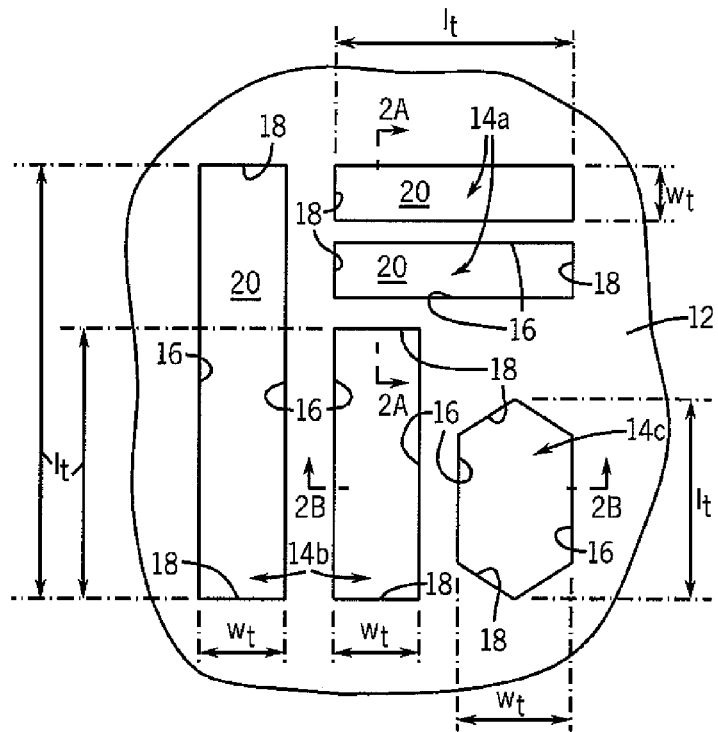
FIGS. 2-3 are diagrammatic top plan views of the substrate of FIG. 1 at subsequent processing steps according an embodiment of the invention.
Figure 2A:
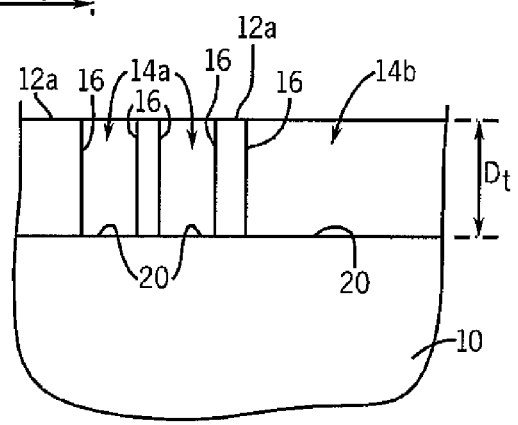
Figure 2B:
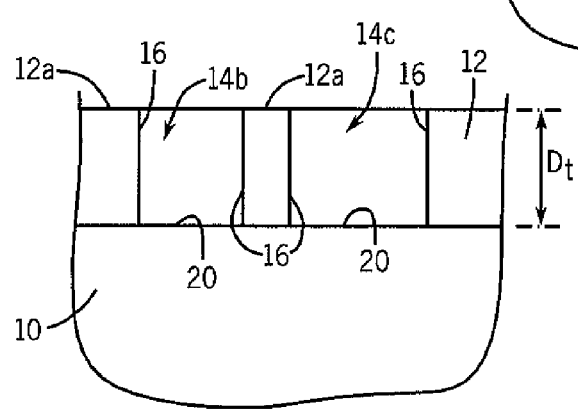

Embodiments of the invention of methods for fabricating arrays of cylinders from thin films of cylindrical-phase self-assembling (SA) block copolymers are described with reference to the figures. As shown in FIGS. 1-1A, a substrate 10 to be etched is provided, being silicon in the illustrated embodiment. Overlying the substrate 10 is a material layer 12. As illustrated in FIGS. 2-2B, the material layer 12 is etched to form a desired pattern of trenches shown as trenches 14a, 14b and 14c.

The trenches can be formed using a lithographic tool having an exposure system capable of patterning at the scale of $L_o$ (10-100 nm). Such exposure systems include, for example, extreme ultraviolet (EUV) lithography, dry lithography (e.g., 248 nm, 193 nm), immersion lithography (e.g., 193 nm), and electron beam lithography, as known and used in the art. Conventional photolithography can attain about 58 nm features. A method called "pitch doubling" or "pitch multiplication" can also be used for extending the capabilities of photolithographic techniques beyond their minimum pitch, as described, for example, in U.S. Pat. No. 5,328,810 (Lowrey et al.), U.S. Pat. No. 7,115,525 (Abatchev, et al.), U.S. Patent Application Publication No. 2006/0281266 (Wells) and U.S. Patent Application Publication No. 2007/0023805 (Wells), the disclosures of which are incorporated by reference herein. Briefly, a pattern of lines is photolithographically formed in a photoresist layer overlying a layer of an expendable material, which in turn overlies a substrate, the expendable material layer is etched to form placeholders or mandrels, the photoresist is stripped, spacers are formed on the sides of the mandrels, and the mandrels are then removed leaving behind the spacers as a mask for patterning the substrate. Thus, where the initial photolithography formed a pattern defining one feature and one space, the same width now defines two features and two spaces, with the spaces defined by the spacers. As a result, the smallest feature size possible with a photolithographic technique is effectively decreased down to about 30 nm or more.

The trenches 14a-14c are structured with opposing sidewalls 16, opposing ends 18, a floor 20, a width ($w_t$), a length ($l_t$) and a depth ($D_t$). Trench 14c is also structured with the trench ends 18 angled to the sidewalls 16, for example, at an about 60° angle, and in some embodiments, the trench ends are slightly rounded. Portions of the material layer 12 form a spacer 12a between the trenches.

The trench sidewalls, edges and floors influence the self-assembly of the polymer blocks and the structuring of the array of nanostructures within the trenches. The boundary conditions of the trench sidewalls 16 impose order in the x-direction (x-axis) and the ends 18 impose order in the y-direction (y-axis) to impose a structure wherein each trench contains n number of features (i.e., cylinders). Other factors that influence the formation and alignment of elements within the trench include the width ($w_t$) of the trench, the formulation of the block copolymer to achieve the desired pitch ($L_o$), the thickness (t) of the block copolymer film, and the wetting nature of the trench surfaces.

Entropic forces drive the wetting of a neutral wetting surface by both blocks, and enthalpic forces drive the wetting of a preferential-wetting surface by the preferred block (e.g., the minority block). The trench sidewalls 16 and ends 18 are structured to be preferential wetting such that upon annealing, the preferred block of the block copolymer will segregate to the sidewalls and edges of the trench to assemble into a thin (e.g., ¼ pitch) interface (wetting) layer, and will self-assemble to form cylinders in the center of a polymer matrix within each trench, the cylinders being in a perpendicular orientation on neutral wetting floor surfaces and half-cylinders in a parallel orientation in relation to preferential wetting floor surfaces.

As illustrated in FIGS. 2-2B, trenches 14a are constructed with a width ($w_t$) of about $2*L_o$ or less, e.g., about $1.5*L_o$ to about $2*L_o$ (e.g., about $1.75*L_o$) ($L_o$ being the inherent periodicity or pitch value of the block copolymer) for forming a 1-D array of cylinders with a center-to-center pitch of at or about $L_o$ (e.g., a width of about 65-75 nm for a $L_o$ value of about 36-42 nm). Trenches 14b, 14c have a width ($w_t$) at or about an integer multiple of the $L_o$ value or $nL_o$ where n=3, 4, 5, etc. (e.g., a width of about 120-2,000 nm for a $L_o$ value of about 36-42 nm). The length (l) of the trenches is at or about $nL_o$ where n is an integer multiple of $L_o$, typically within a range of about $n*10$–$n*100$ nm (with n being the number of features or structures (i.e., cylinders)). The depth ($D_t$) of the trenches generally over a range of about 50-500 nm. The width of the spacer 12a between adjacent trenches can vary and is generally about $L_o$ to about $nL_o$.

Figure 3:
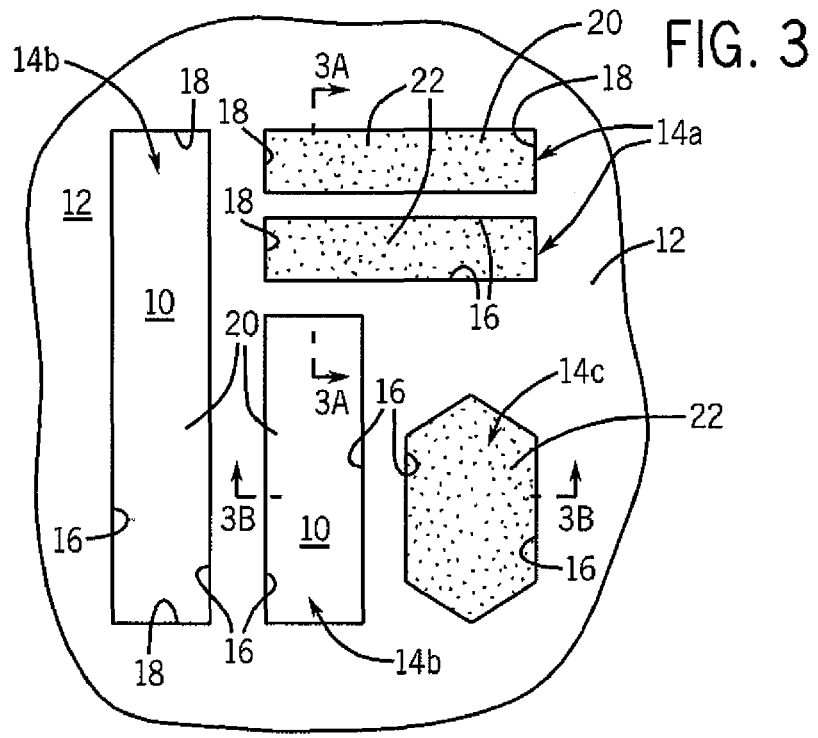
Figure 3A:
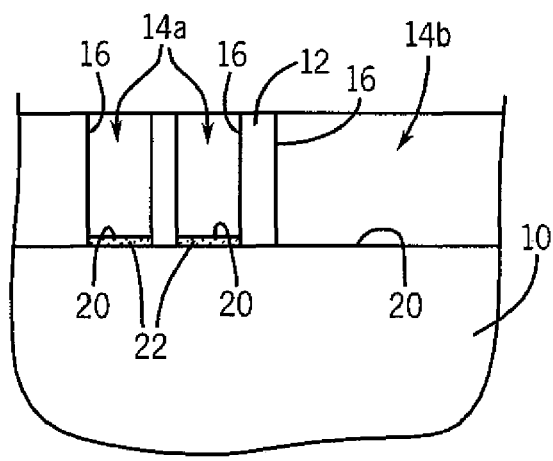
Figure 3B:
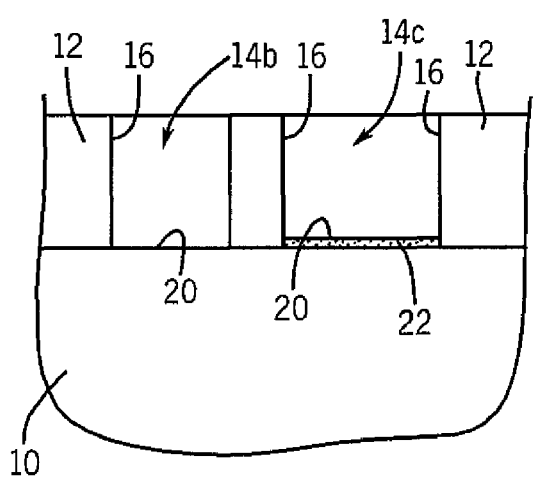

As shown in FIGS. 3-3B, the floors 20 of trenches 14a, 14c have a neutral wetting surface (layer 22) to induce formation of perpendicular cylinders within those trenches, and the floors 20 of trenches 14b are preferential wetting by one block of a self-assembling block copolymer to induce formation of parallel half-cylinders in those trenches. The application and annealing of a cylindrical-phase block copolymer material having an inherent pitch value of about $L_o$ in the trenches will result in a single row of "n" perpendicular cylinders in trenches 14a for the length of the trenches, "n" rows or lines of half-cylinders (parallel to the sidewalls and trench floor) extending the length ($l_t$) and spanning the width ($w_t$) of trenches 14b, and a periodic hexagonal close-pack or honeycomb array of perpendicular cylinders within trench 14c. The cylindrical domains are separated by a center-to-center distance (pitch distance (p)) of at or about $L_o$.

For example, a block copolymer having a 35-nm pitch ($L_o$ value) deposited into a 75-nm wide trench having a neutral wetting floor will, upon annealing, result in a zigzag pattern of 35-nm diameter perpendicular cylinders that are offset by a half distance for the length ($l_b$) of the trench, rather than a single line of perpendicular cylinders aligned with the sidewalls down the center of the trench. As the $L_o$ value of the copolymer is increased, for example, by forming a ternary blend by the addition of both constituent homopolymers, there is a shift from two rows to one row of the perpendicular cylinders within the center of the trench.

In some embodiments, the substrate 10 can be a material that is inherently preferential wetting to one of the blocks, and a neutral wetting surface layer 22 can be provided by applying a neutral wetting polymer (e.g., a neutral wetting random copolymer) onto the substrate 10 and then selectively removing the layer 22 to expose portions of the preferential wetting surface of the substrate 10. For example, in the use of a poly(styrene-block-methyl methacrylate) block copolymer (PS-b-PMMA), a random PS:PMMA copolymer (PS-r-PMMA) which exhibits non-preferential or neutral wetting toward PS and PMMA can be applied. The polymer layer can be affixed by grafting (on an oxide substrate) or by cross-linking (any surface) using UV radiation or thermal processing.

Figure 4:
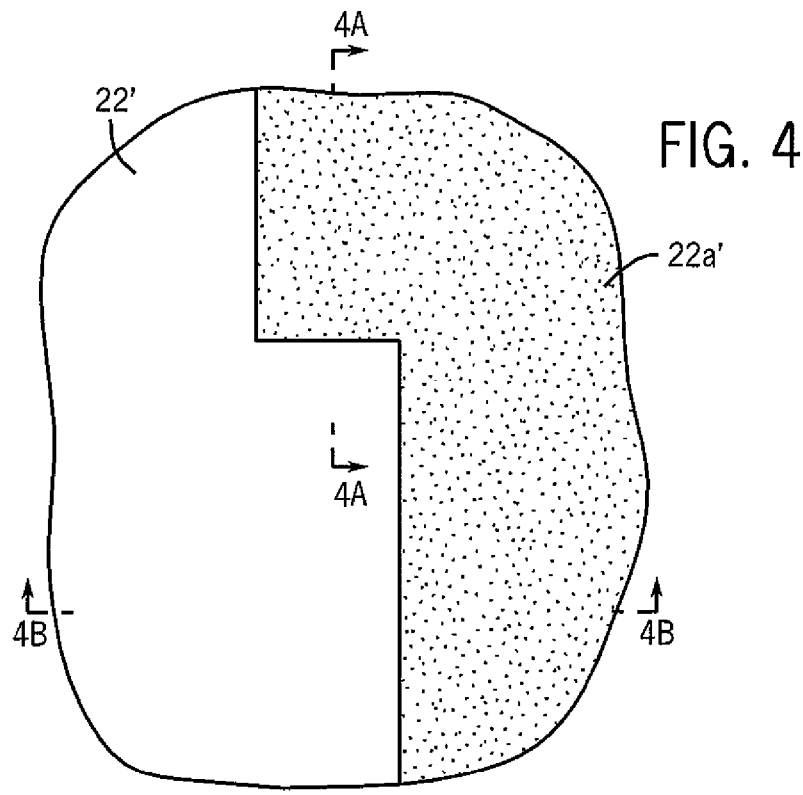
FIG. 4 is a diagrammatic top plan view of a portion of a substrate at a preliminary processing stage according to another embodiment of the disclosure.
Figure 4A:
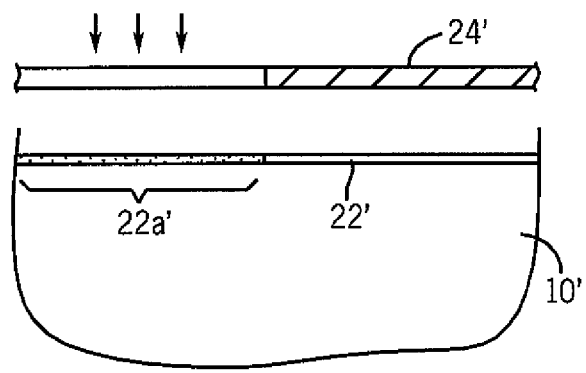
FIGS. 4A-4B are elevational, cross-sectional views of portions of the substrate depicted in FIG. 4 taken, respectively, along lines 4A-4A and 4B-4B.
Figure 4B:
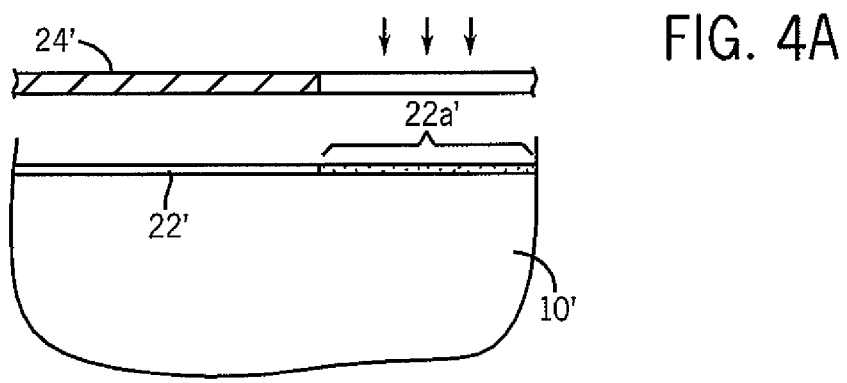
Figure 5:
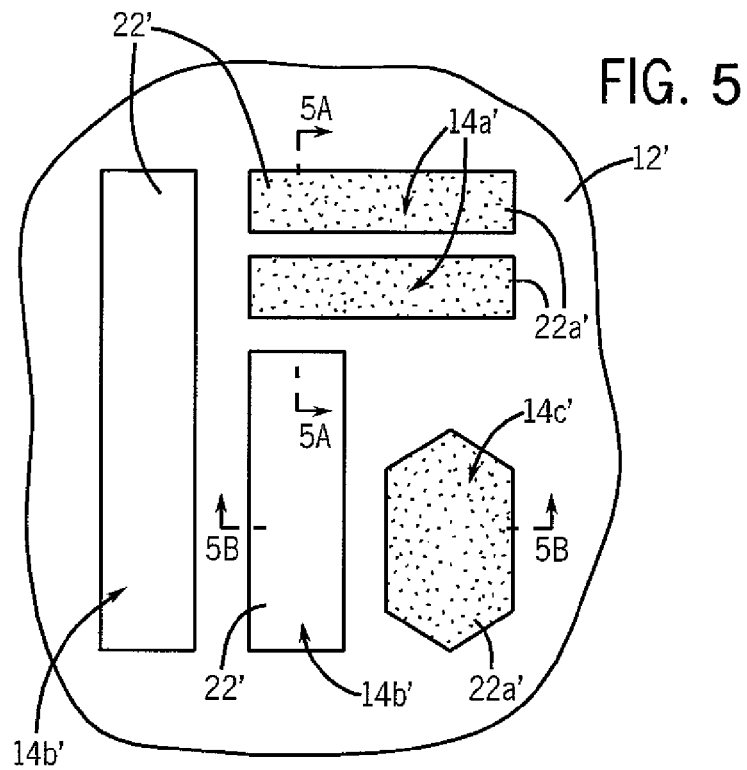
FIGS. 5-6 illustrate diagrammatic top plan views of the substrate depicted in FIG. 4 at subsequent processing stages.
Figure 5A:
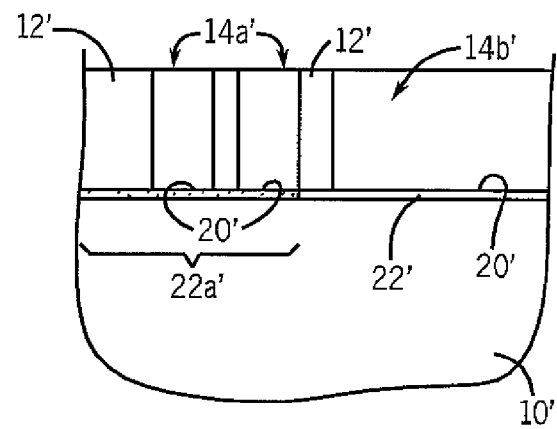
Figure 5B:
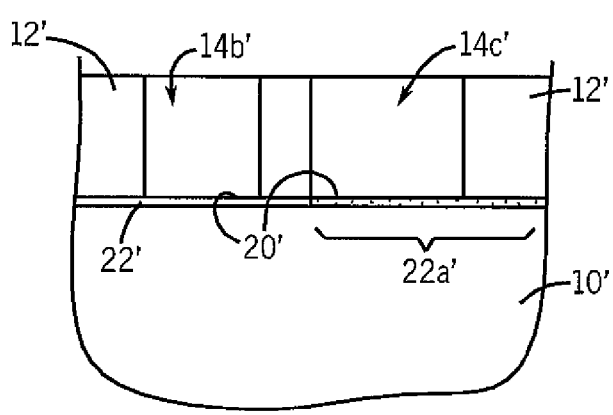
Figure 6:
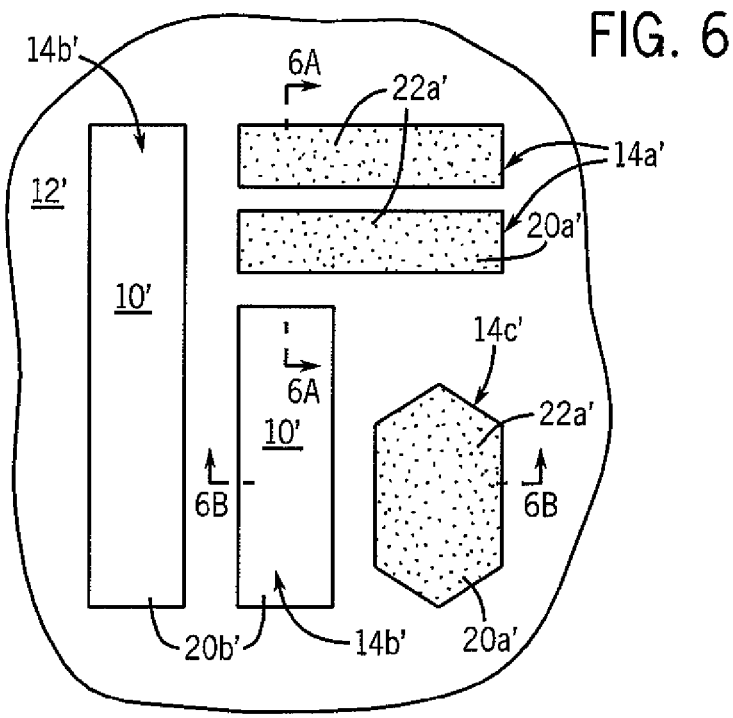
Figure 6A:
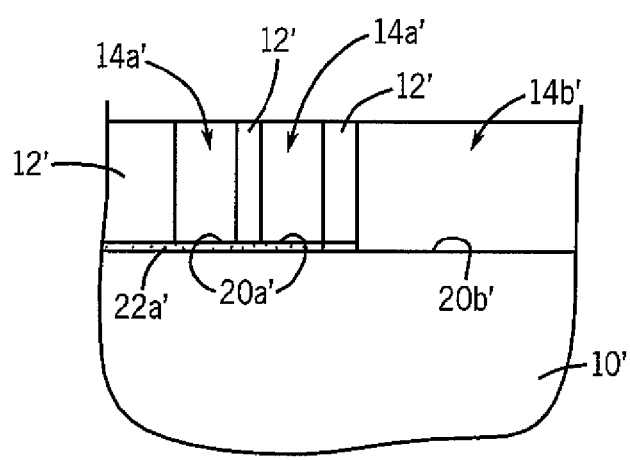
Figure 6B:
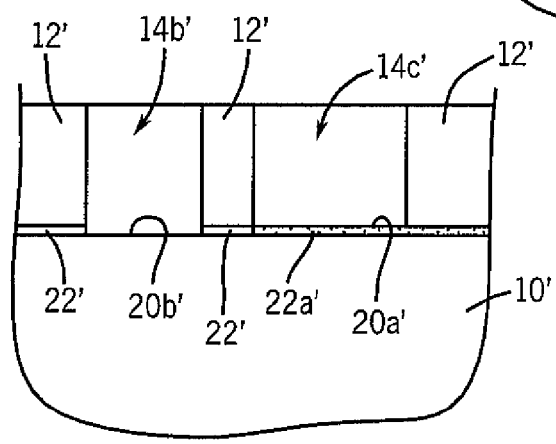

As shown in FIGS. 4-4B, in some embodiments, a neutral wetting layer 22' can be formed on the substrate 10' prior to forming the overlying material layer 12'. For example, a blanket layer 22' of a photo-cross-linkable random copolymer (e.g., PS-r-PMMA) can be spin coated onto the substrate 10' and photo-cross-linked (arrows ↓↓↓) in select areas 22a' using a reticle 24', for example. The material layer 12' can then be formed over layer 22' and the trenches etched to expose the neutral wetting layer 22' at the trench floors 20', as depicted in FIGS. 5-5B, including cross-linked sections 22a'. As shown in FIGS. 6-6B, non-cross-linked and exposed regions of the neutral wetting layer 22' can then be selectively removed, e.g., by a solvent rinse, to expose the substrate 10' (e.g., silicon with native oxide) as a preferential wetting surface 20b' in trenches 14b', with the cross-linked neutral wetting layer 22a' providing a neutral wetting surface 20a' in trenches 14a', 14c'.

Figure 8:
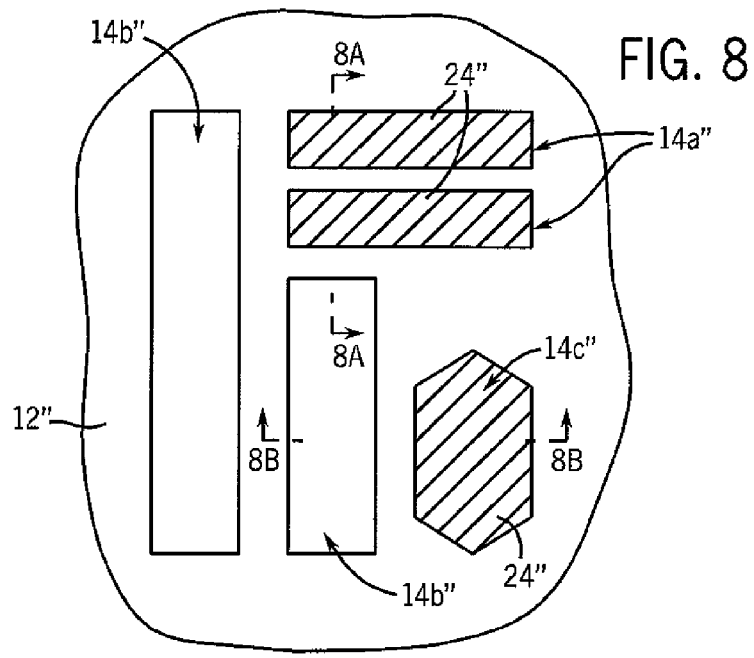
Figure 8A:
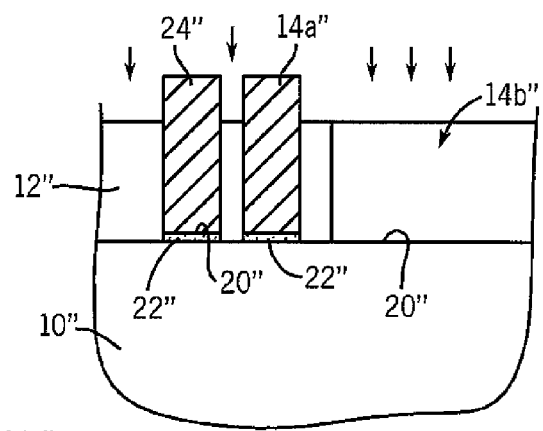
Figure 8B:
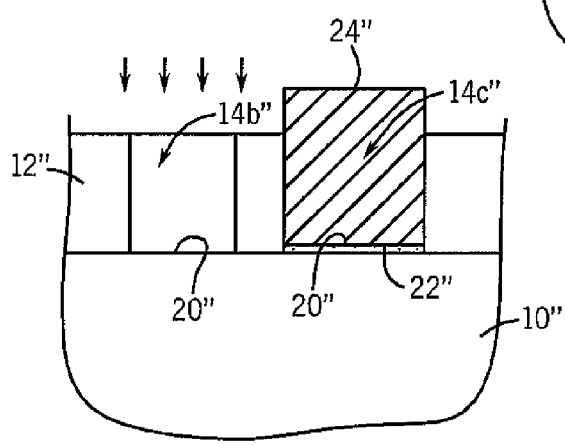

In another embodiment depicted in FIGS. 7-7B, a neutral wetting random copolymer can be applied after forming the trenches, for example, as a blanket coat by spin-coating into each of the trenches 14a"-14c" and thermally processed (↓↓↓) to flow the material into the bottom of the trenches by capillary action, which can result in cross-linking the neutral wetting polymer layer 22". To remove the cross-linked polymer layer 22" from selected regions, a photoresist layer 24" can be coated over the structure, patterned and developed as shown in FIGS. 8-8B, and an oxygen ($O_2$) dry etch (arrows ↓↓↓) can be conducted to remove the cross-linked random copolymer layer 22" from trenches 14b" where a preferential wetting floor is desired, by exposing the substrate 10" (e.g., silicon with native oxide). The photoresist 24" can then be removed, resulting in the structure shown in FIGS. 3-3B.

For example, a neutral wetting polymer (NWP) such as a random copolymer of polystyrene (PS), polymethacrylate (PMMA) with hydroxyl group(s) (e.g., 2-hydroxyethyl methacrylate (P(S-r-MMA-r-HEMA)) (e.g., about 58% PS) can be can be selectively grafted to a material layer (e.g., an oxide floor) as a layer 22" of about 5-10 nm thick by heating at about 160° C. for about 48 hours (FIGS. 7-7B). See, for example, In et al., *Langmuir*, 2006, 22, 7855-7860, the disclosure of which is incorporated by reference herein. The grafted polymer can then be removed from trenches 14b" by applying and developing a photoresist layer 24" and etching (e.g., $O_2$ dry etch) the exposed polymer layer 22" to produce preferential wetting floors (e.g., substrate 10" of silicon with native oxide) in trenches 14b" (FIGS. 8-8B).

A surface that is neutral wetting to PS-b-PMMA can also be prepared by spin coating a blanket layer of a photo- or thermally cross-linkable random copolymer such as a benzocyclobutene- or azidomethylstyrene-functionalized random copolymer of styrene and methyl methacrylate (e.g., poly (styrene-r-benzocyclobutene-r-methyl methacrylate (PS-r-PMMA-r-BCB)). For example, such a random copolymer can comprise about 42% PMMA, about (58-x) % PS and x % (e.g., about 2-3%) of either polybenzocyclobutene or poly (para-azidomethylstyrene)). An azidomethylstyrene-functionalized random copolymer can be UV photo-cross-linked (e.g., 1-5 MW/cm^2 exposure for about 15 seconds to about 30 minutes) or thermally cross-linked (e.g., at about 170° C. for about 4 hours) to form a cross-linked polymer mat as a neutral wetting layer 22". A benzocyclobutene-functionalized random copolymer can be thermally cross-linked (e.g., at about 200° C. for about 4 hours or at about 250° C. for about 10 minutes). The layer 22" can be globally photo- or thermalcross-linked (FIGS. 7-7B), masked using a patterned photoresist 24'' (FIGS. 8-8B), and the unmasked sections can be selectively removed by etching (arrows ↓↓↓) (e.g., $O_2$ etch) to expose preferential-wetting floors 20'', e.g., substrate 10'' of silicon with native oxide, in trenches 14b'''.

In other embodiments, as illustrated in FIGS. 9-9B, portions of the neutral wetting layer 22''' in trenches 14a''', 14c''' can be photo-cross-linked through a reticle 24''' (arrows ↓↓↓) and the non-cross-linked material in trenches 14b''' can be removed, for example, using a solvent rinse, resulting in the structure shown in FIGS. 3-3B.

Figure 10:
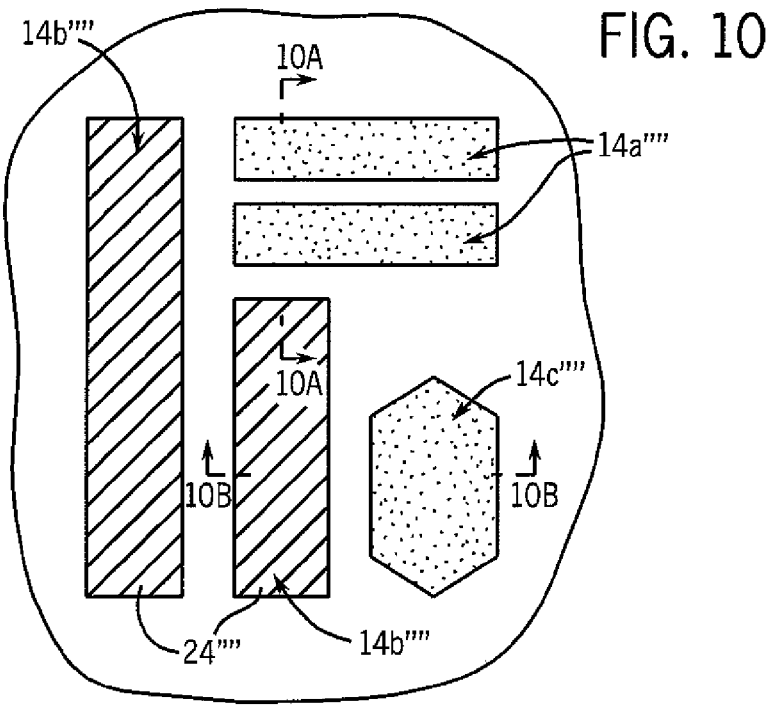
FIG. 10 is a diagrammatic top plan view of the substrate of FIG. 2 at a subsequent processing step according to another embodiment of the disclosure.
Figure 10A:
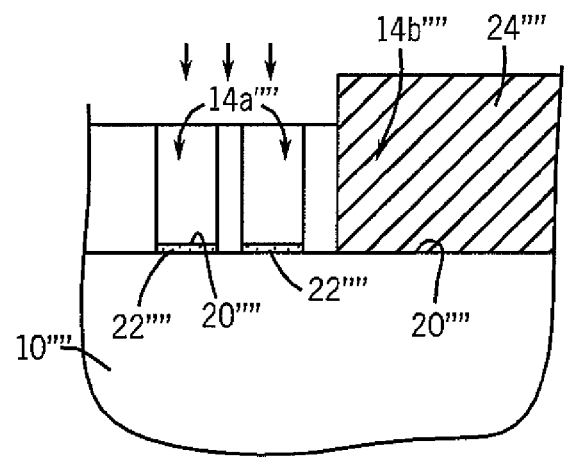
FIGS. 10A-10B depict elevational, cross-sectional view of a portion of the substrate depicted in FIG. 10 taken, respectively, along lines 10A-10A and 10B-10B.
Figure 10B:
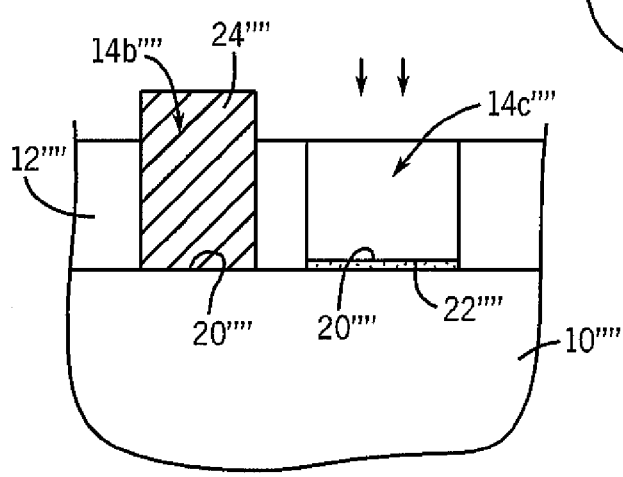

Referring now to FIGS. 10-10B, in another embodiment in which the substrate 10'''' is silicon (with native oxide), another neutral wetting surface for PS-b-PMMA can be provided by hydrogen-terminated silicon. For example, the floors 20'''' of trenches 14b'''' can be masked, e.g., using a patterned photoresist layer 24'''', and the floors 20'''' of trenches 14a'''', 14c'''' can be selectively etched (arrows ↓↓↓), for example, with a hydrogen plasma, to remove the oxide material and form hydrogen-terminated silicon 22'''', which is neutral wetting with equal affinity for both blocks of a block copolymer material such as PS-b-PMMA. H-terminated silicon can be prepared by a conventional process, for example, by a fluoride ion etch of a silicon substrate (with native oxide present, about 12-15 Å) by exposure to an aqueous solution of hydrogen fluoride (HF) and buffered HF or ammonium fluoride ($NH_4F$), by HF vapor treatment, or by a hydrogen plasma treatment (e.g., atomic hydrogen). The photoresist layer 24'''' can then be removed, resulting in a structure as shown in FIGS. 3-3B.

In other embodiments, a neutral wetting layer (22) can be provided by grafting a random copolymer such as PS-r-PMMA selectively onto an H-terminated silicon substrate (e.g., 20''' floor) in FIGS. 10-10B by an in situ free radical polymerization of styrene and methyl methacrylate using a di-olefinic linker such divinyl benzene which links the polymer to the surface to produce an about 10-15 nm thick film.

In other embodiments, a layer of a preferential wetting material can be applied onto the surface of the substrate exposed as the floors of trenches 14b''. For example, a layer of oxide or silicon nitride, etc., can be deposited as a blanket layer into the trenches 14b''(e.g., as shown in FIGS. 7-7B), followed by selective removal of the material from the floor of trenches 14a'', 14c'' to expose a neutral wetting surface or, in other embodiments, a neutral wetting material (e.g., a random copolymer) can then be selectively applied onto the exposed floors of trenches 14a'', 14c''.

In yet another embodiment, the floors of the trenches can be made neutral or preferential wetting by varying the roughness of the surface of the floors of the trenches, as described, for example, in Sivaniah et al., *Macromolecules* 2005, 38, 1837-1849, and Sivaniah et al., *Macromolecules* 2003, 36, 5894-5896, the disclosure of which are incorporated by reference herein. A grooved, or periodic, grating-like substrate topography having a lateral periodicity and structure at or above a critical roughness value (e.g., $q_sR$ where $q_s=2\pi/\lambda_s$, R is the (root-mean-square) vertical displacement of the surface topography about a mean horizontal plane, and $\lambda_s$ is the lateral periodicity in the surface topography) can be provided to form a neutral wetting surface (e.g., trenches 14a, 14c) for formation of perpendicular cylinders (under conditions of a neutral wetting air surface). The floors of trenches 14b can be provided with a low surface roughness below the critical $q_sR$, value for formation of parallel-oriented half-cylinders in those trenches. The critical roughness of the floor surface topography can also be adjusted according to the molecular weight of the block copolymer to achieve a perpendicular orientation of cylinders. The roughness of the substrate surface can be characterized using atomic force microscopy (AFM).

For example, as shown in FIGS. 11-11B, in some embodiments, the floors of trenches 14a$^v$, 14c$^v$ can be selectively etched (arrows ↓↓↓) to provide a pattern of grooves 26$^v$ at or above a critical roughness ($q_sR$), the floors being sufficiently rough to form a neutral wetting surface to induce formation of perpendicular-oriented cylinders within those trenches. In other embodiments, a material 26$^v$ such as indium tin oxide (ITO), can be e-beam deposited (arrows ↓↓↓) onto the surface of floors 20$^v$ of trenches 14a$^v$, 14c$^v$ to form a sufficiently rough and neutral wetting surface and, in some embodiments, sputter coated onto the surface of floors 20$^v$ of trenches 14b$^v$ to form a relatively smooth and preferential wetting surface.

Referring now to FIGS. 3-3B, the sidewalls 16 and ends 18 of the trenches are preferential wetting by one block of the copolymer. The material layer 12 defining the trench surfaces can be an inherently preferential wetting material, or in other embodiments, a layer of a preferential wetting material can be applied onto the surfaces of the trenches. For example, in the use of a PS-b-PMMA block copolymer, the material layer 12 can be composed of silicon (with native oxide), oxide (e.g., silicon oxide, $SiO_x$), silicon nitride, silicon oxycarbide, ITO, silicon oxynitride, and resist materials such as such as methacrylate-based resists, among other materials, which exhibit preferential wetting toward the PMMA block. In other embodiments, a layer of a preferential wetting material such as a polymethylmethacrylate (PMMA) polymer modified with an —OH containing moiety (e.g., hydroxyethylmethacrylate) can be applied onto the surfaces of the trenches, for example, by spin coating and then heating (e.g., to about 170° C.) to allow the terminal OH groups to end-graft to oxide sidewalls 16 and ends 18 of the trenches. Non-grafted material can be removed by rinsing with an appropriate solvent (e.g., toluene). See, for example, Mansky et al., *Science*, 1997, 275, 1458-1460, and In et al., *Langmuir*, 2006, 22, 7855-7860, the disclosures of which are incorporated by reference herein.

Referring now to FIGS. 12-12B, a cylindrical-phase self-assembling block copolymer material 28 having an inherent pitch at or about $L_o$ (or a ternary blend of block copolymer and homopolymers blended to have a pitch at or about $L_o$) is then deposited, typically by spin casting or spin-coating into the trenches 14a-14c and onto the floors 20. The block copolymer material can be deposited onto the patterned surface by spin casting from a dilute solution (e.g., about 0.25-2 wt % solution) of the copolymer in an organic solvent such as dichloroethane ($CH_2Cl_2$) or toluene, for example.

The copolymer material layer 28 is deposited into the trenches 14a-14c to a thickness (t) such that during an anneal, the capillary forces pull excess material (e.g., greater than a monolayer) into the trenches 14a-14c. The resulting thickness of layer 28 in the trench is at about the $L_o$ value of the copolymer material such that the copolymer film layer will self-assemble upon annealing to form an array of cylindrical elements, for example, perpendicular cylindrical domains having a diameter at or about 0.5 $L_o$ (e.g., about 20 nm) over the neutral wetting surface 22 of trenches 14a, 14c, and a single layer of lines of parallel-oriented half-cylinders with a diameter at or about 0.5 $L_o$ over the preferential wetting floor 20 of trenches 14b. The film thickness can be measured, for example, by ellipsometry. Depending on the depth ($D_t$) of the trenches, the cast block copolymer material 28 can fill the trenches where the trench depth is about equal to $L_o$ ($D_t\sim L_o$), or form a thinner film over the trench floor where the trench depth ($D_t$) is greater than $L_o$ ($D_t>L_o$) as depicted. A thin film of the copolymer material 28 generally less than $L_o$ can be deposited on the spacers 12a, this material will not self-assemble, as it is not thick enough to form structures.

Although diblock copolymers are used in the illustrative embodiment, other types of block copolymers (i.e., triblock or multiblock copolymers) can be used. Examples of diblock copolymers include poly(styrene-block-methyl methacrylate) (PS-b-PMMA), polyethyleneoxide-polyisoprene, polyethyleneoxide-polybutadiene, polyethyleleoxide-polystyrene, polyetheleneoxide-polymethylmethacrylate, polystyrene-polyvinylpyridine, polystyrene-polyisoprene (PS-b-PI), polystyrene-polybutadiene, polybutadiene-polyvinylpyridine, and polyisoprene-polymethylmethacrylate, among others. Examples of triblock copolymers include poly (styrene-block methylmethacrylate-block-ethylene oxide). An example of a PS-b-PMMA copolymer material ($L_o$=35 nm) is composed of about 70% PS and 30% PMMA with a total molecular weight (Me) of 67 kg/mol, to form 20 nm diameter cylindrical PMMA domains in a matrix of PS.

The block copolymer material can also be formulated as a binary or ternary blend comprising a SA block copolymer and one or more homopolymers of the same type of polymers as the polymer blocks in the block copolymer, to produce blends that swell the size of the polymer domains and increase the $L_o$ value of the polymer. The volume fraction of the homopolymers can range from 0 to about 40%. An example of a ternary diblock copolymer blend is a PS-b-PMMA/PS/PMMA blend, for example, 46K/21K PS-b-PMMA containing 40% 20K polystyrene and 20K poly(methylmethacrylate). The $L_o$ value of the polymer can also be modified by adjusting the molecular weight of the block copolymer.

Optionally, ellipticity ("bulging") can be induced in the structures by creating a slight mismatch between the trench and the spacer widths and the inherent pitch ($L_o$) of the block copolymer or ternary blend, as described, for example, by Cheng et al., "Self-assembled One-Dimensional Nanostructure Arrays," *Nano Lett.*, 6 (9), 2099-2103 (2006), which then reduces the stresses that result from such mismatches.

Figure 13:
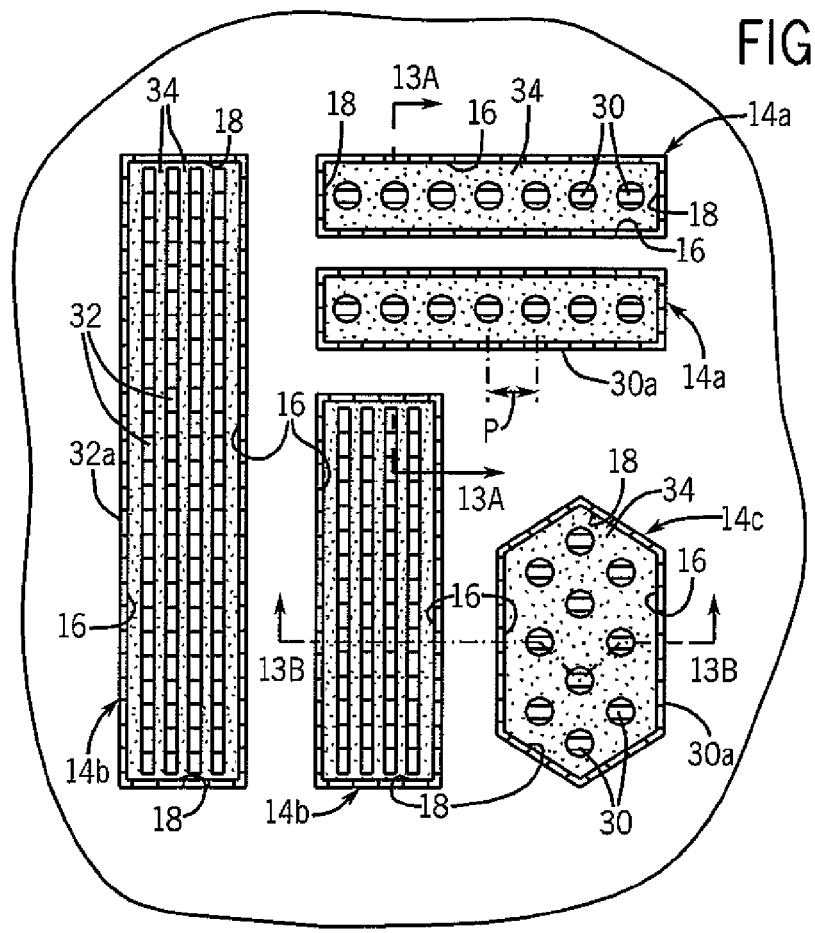
Figure 13A:
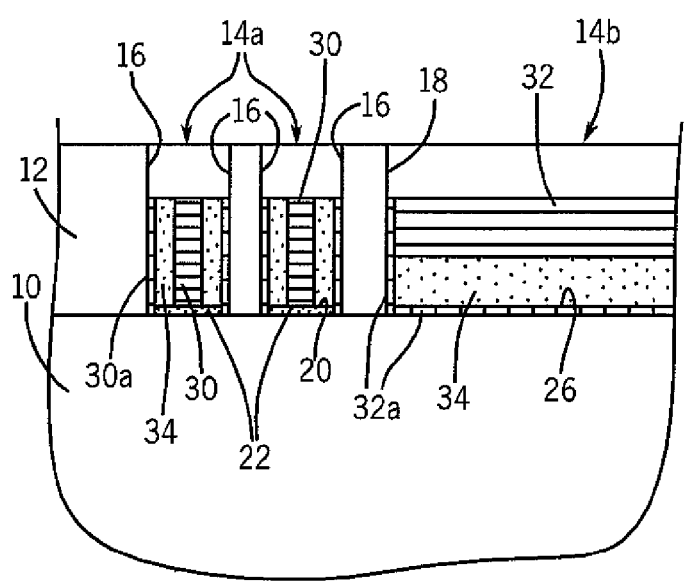

Referring now to FIGS. 13-13B, the block copolymer film 28 is then annealed to cause the component polymer blocks to phase separate and self-assemble according to the wetting material on the trench floors 20 and the preferential wetting surfaces of the trench sidewalls 16 and ends 18. This imposes ordering on the block copolymer film as it is annealed and the blocks self-assemble, resulting in a 1-D array of perpendicular-oriented cylinders 30 (minority block) in a matrix 34 (majority block) for the length ($nL_o$) of each trench 14a (neutral wetting floor), parallel-oriented half-cylinder(s) 32 in a matrix 34 for the length of each trench 14b, and a hexagonal close pack array of perpendicular cylinders 30 in trench 14c. A layer 30a, 32a of the minority block wets the preferential wetting sidewalls 16 and ends 18 of the trenches 14a-14c.

The copolymer film can be thermally annealed to above the glass transition temperature of the component blocks of the copolymer material. For example, a PS-b-PMMA copolymer film can be annealed at a temperature of about 180-285° C. in a vacuum oven for about 1-24 hours to achieve the self-assembled morphology. The resulting morphologies of the block copolymer (i.e., perpendicular and parallel orientation of cylinders) can be examined, for example, using atomic force microscopy (AFM), transmission electron microscopy (TEM), and scanning electron microscopy (SEM).

The diameter of the perpendicular cylinders 30 and width of the half-cylinders 32 is generally about 0.5 $L_o$ (e.g., about 20 nm). The center-to-center distance (pitch distance, p) between adjacent cylindrical domains within a trench is generally at or about $L_o$ (e.g., about 40 nm for a 46/21 PS/PMMA block copolymer).

The hexagonal array of perpendicular cylinders 30 in trench 14c contains n rows of cylinders according to the width ($w_t$) of the trench with the cylinders in each row being offset by about $L_o$ (pitch distance (p) or center-to-center distance) from the cylinders in the adjacent rows. Each row contains "in" number of cylinders according to the length ($l_t$) of the trench and the shape of the trench ends 18 (e.g., rounded, angled, etc.), with some rows having greater or less than m cylinders. The perpendicular cylinders 30 are spaced apart at a pitch distance (p) at or about $L_o$ between cylinders in the same row and an adjacent row, and at a pitch distance (p) at or about $L_o*\cos(\pi/6)$ or about $0.866*L_o$ distance between two parallel lines where one line bisects the cylinders in a given row and the other line bisects the cylinders in an adjacent row.

The annealed and ordered film may then be treated to cross-link the polymer segments (e.g., the PS matrix 34) to fix and enhance the strength of the self-assembled polymer blocks within the trenches. The polymers can be structured to inherently cross-link (e.g., upon exposure to ultraviolet (UV) radiation, including deep ultraviolet (DUV) radiation), or one or both of the polymer blocks of the copolymer material can be formulated to contain a cross-linking agent. Non-ordered material outside the trenches (e.g., on spacers 12a) may then be removed.

For example, in one embodiment, the trench regions can be selectively exposed through a reticle (not shown) to cross-link only the self-assembled films within the trenches, and optionally, a wash can then be applied with an appropriate solvent (e.g., toluene) to remove non-cross-linked portions of the film 28 (e.g., on the spacers 12a). In another embodiment, the annealed films can be cross-linked globally, a photoresist layer can be applied to pattern and expose the areas of the film outside the trench regions (e.g., over the spacers 12a), and the exposed portions of the film can be removed, for example by an oxygen ($O_2$) plasma treatment. In other embodiments, the spacers 12a are narrow in width, for example, a width ($w_s$) of one of the copolymer domains (e.g., about $L_o$) such that the non-cross-linked block copolymer material 28 on the spacers is minimal and no removal is required. Material on the spacers 12a that is generally featureless need not be removed.

Figure 14A:
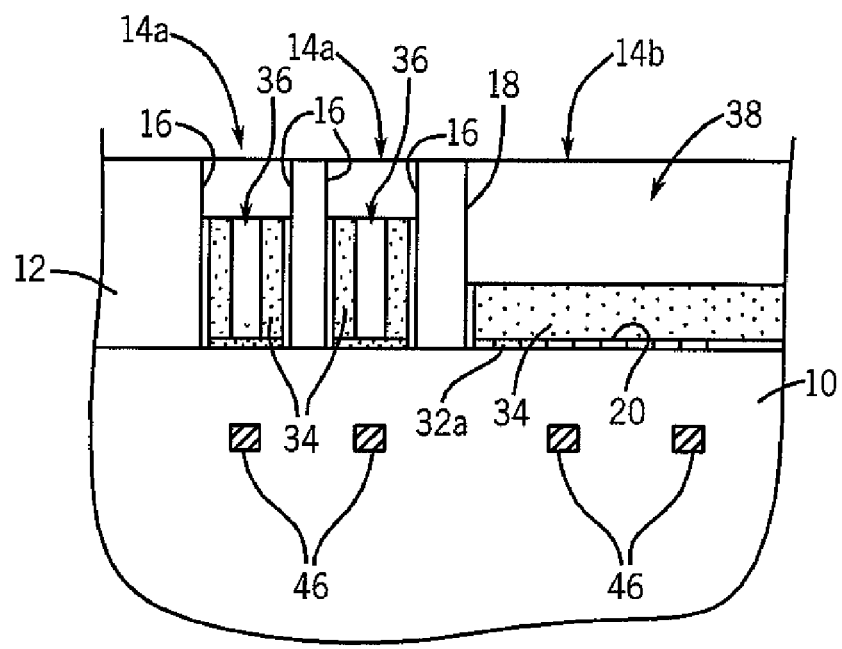
Figure 14B:
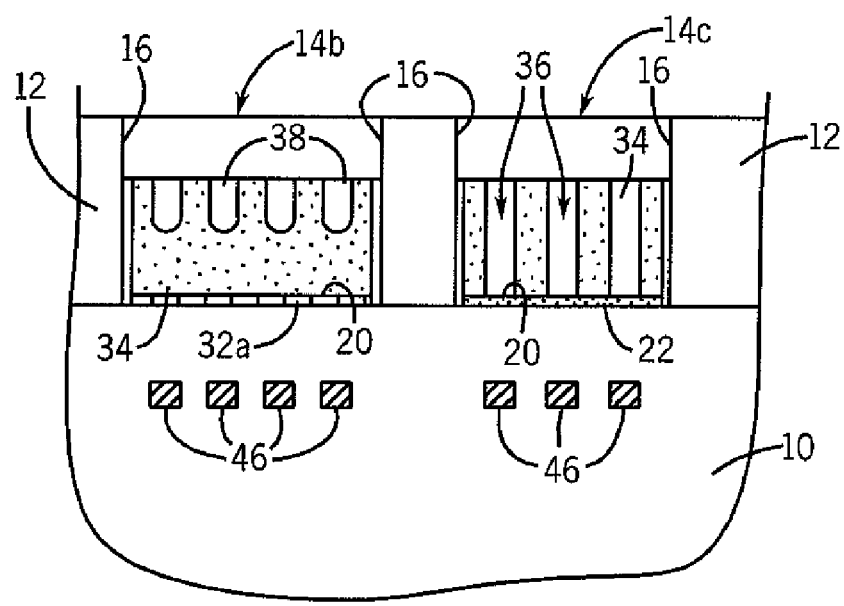

After annealing and the copolymer material is ordered, the minority polymer domains can be selectively removed from the films to produce a template for use in patterning the substrate 10. For example, as shown in FIGS. 14-14B, selective removal of the cylindrical domains 30, 32 (e.g., of PMMA) will produce an array of openings 36, 38 within the polymer matrix 34 (e.g., of PS), with the openings varying according to the orientation of the cylindrical domains within the trenches. Only openings 36 will extend to the trench floors 20, with the majority block matrix component 34 (e.g., PS) remaining underneath the lines of half-cylinder openings 38.

Figure 15A:
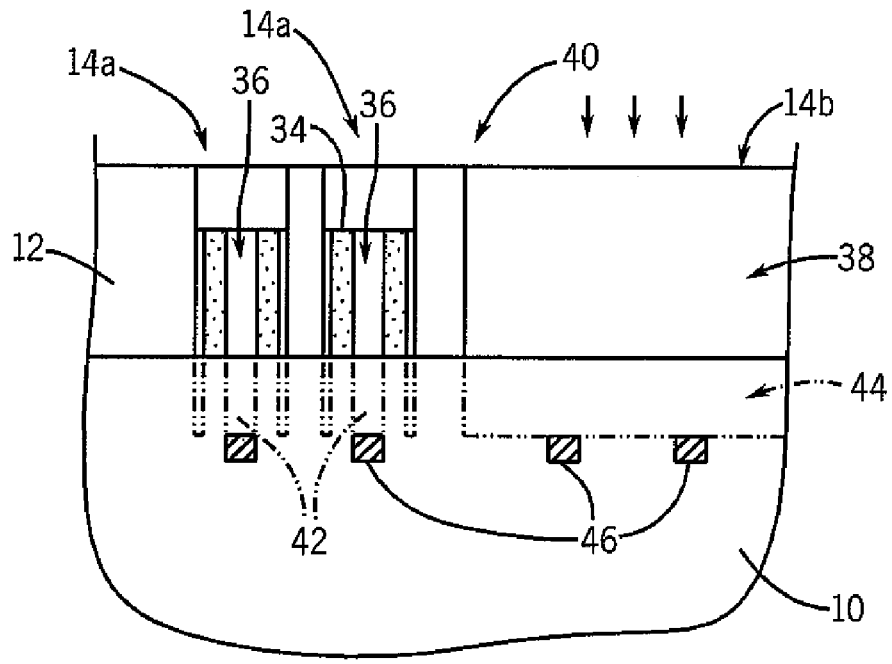
FIGS. 15A-15B are cross-sectional views of the substrate depicted in FIGS. 14A-14B, respectively, at a subsequent processing stage.
Figure 15B:
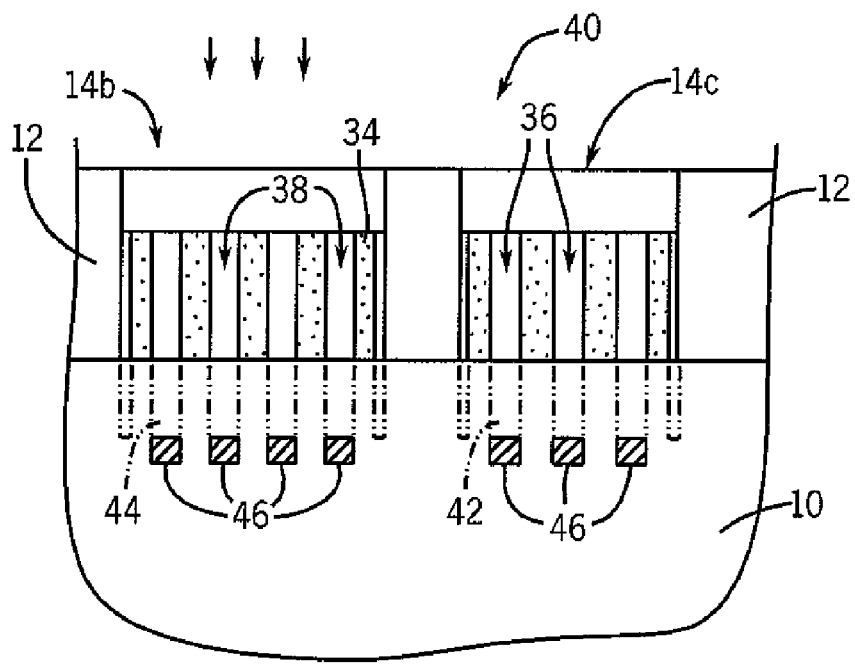
Figure 16B:
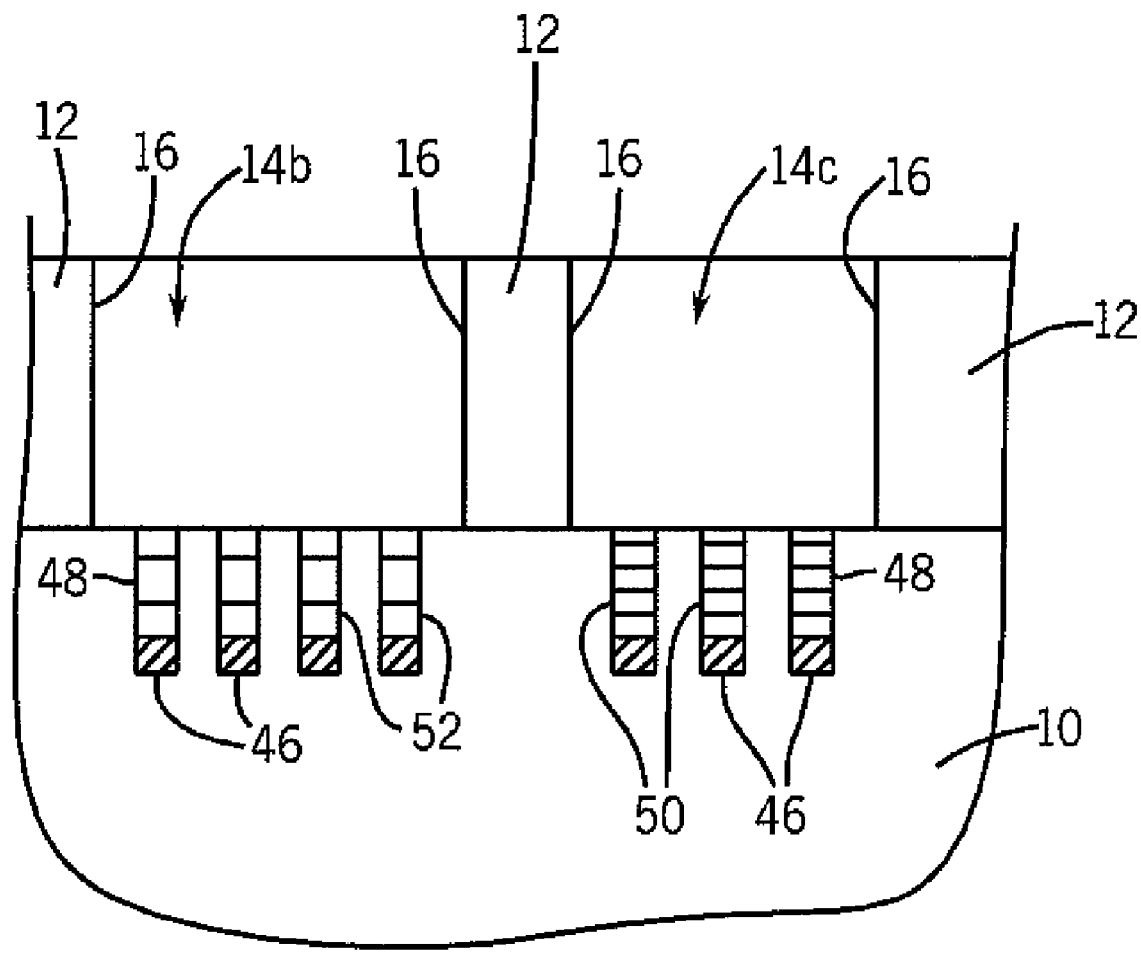

As shown in FIGS. 15A-15B, the half-cylinder openings 38 can be extended to expose the underlying substrate 10 by removing the underlying matrix component 34 (e.g., PS), for example, by a plasma $O_2$ etch. The cylindrical openings 36 generally have a diameter of about 5-50 nm and an aspect ratio of about 1:1 to about 1:2, and the lined openings (grooves) 38 have a width of about 5-50 nm and an aspect ratio of about 1:1. Resulting film 40 can then be used in patterning (arrows ↓↓) the substrate 10 to form a configuration of cylindrical openings 42 and grooves (lines) 44 (shown in phantom) extending to active areas or elements 46. The residual matrix 34 (film 40) can be removed and the openings 42, 44 filled with a material 48 e.g., a metal or conductive alloy such as Cu, Al, W, Si, and $Ti_3N_4$, among others, as shown in FIGS. 16-16B to form arrays of cylindrical contacts 50 and parallel conductive lines 52, for example, to an underlying active area, contact, or conductive line 46. The cylindrical openings 42 can also be filled with a metal-insulator-metal-stack to form capacitors with an insulating material such as $SiO_2$, $Al_2O_3$, $HfO_2$, $ZrO_2$, $SrTiO_3$, and the like. Further processing can be conducted as desired.

Methods of the disclosure provide a means of generating self-assembled diblock copolymer structures where perpendicular cylinders preferentially form on some regions on a substrate and parallel cylinders form on other regions. In some embodiments, the desired orientation is controlled by the structure of the substrate (e.g., wafer) and/or the nature of the surface material. The methods provide ordered and registered elements on a nanometer scale that can be prepared more inexpensively than by electron beam lithography or EUV photolithography. The feature sizes produced and accessible by this invention cannot be prepared by conventional photolithography. Embodiments of the invention can be used to pattern lines and openings (holes) on a substrate in the same patterning step, thus eliminating processing steps compared to conventional process flows. The described methods can be readily employed and incorporated into existing semiconductor manufacturing process flows.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method for fabricating nanoscale microstructures, comprising:
    forming a film comprising a cylindrical-phase block copolymer within a plurality of trenches to a thickness of about $L_o$, each trench having a width, length, sidewalls, ends and a floor, wherein the sidewalls and ends of the trenches are preferential wetting to a first block of the block copolymer, the floor of at least one trench is preferential wetting to the first block and the floor of another trench is neutral wetting to a second block of the block copolymer; and
    causing the block copolymer film to self-assemble to form perpendicularly-oriented cylindrical domains of the minority block of the block copolymer in a matrix of a majority block within trenches having said neutral wetting floor, and parallel-oriented half-cylindrical domains of the minority block in a matrix of the majority block within trenches having the preferential wetting floor.

2. The method of claim 1, wherein the at least one trench with a neutral wetting floor has a width of about $1.5*L_o$ to about $2*L_o$.

3. The method of claim 1, wherein the at least one trench with a neutral wetting floor has a width of about $nL_o$ where n is an integer multiple greater than one.

4. The method of claim 3, wherein the ends of the trench are curved.

5. The method of claim 1, wherein the preferential wetting floor comprises a material selected from the group consisting of silicon (with native oxide), oxide, silicon nitride, silicon oxycarbide, silicon oxynitride, indium tin oxide, and methacrylate-based resists.

6. The method of claim 1, wherein the preferential wetting floor comprises a material having a surface roughness below a critical roughness for preferential wetting of the block copolymer.

7. The method of claim 6, wherein the preferential wetting floor induces a parallel orientation of cylindrical domains on the preferential wetting floor.

8. The method of claim 1, wherein the neutral wetting floor comprises a layer of a random copolymer.

9. The method of claim 1, wherein the neutral wetting floor comprises a layer of hydrogen-terminated silicon.

10. The method of claim 1, wherein the sidewalls and ends comprise a preferential wetting material selected from the group consisting of silicon (with native oxide), oxide, silicon nitride, silicon oxycarbide, silicon oxynitride, and methacrylate-based resists.

11. The method of claim 1, further comprising applying a preferential wetting material to the sidewalls and ends of the trenches.

12. The method of claim 1, further comprising cross-linking the self-assembled film.

13. The method of claim 1, further comprising, after causing the block copolymer film to self-assemble, selectively removing the minority polymer block to provide an array of perpendicular-oriented cylindrical openings and parallel-oriented half-cylindrical openings within the matrix of the majority polymer block.

14. The method of claim 13, further comprising extending the half-cylindrical openings to expose the floor of the trench.

15. A method for fabricating nanoscale microstructures, comprising:
    forming a material layer on a substrate, the material layer and the substrate being preferential wetting to a first block of a block copolymer;
    forming a plurality of trenches in the material layer, each trench having a width, length, sidewalls, ends and a floor, wherein the sidewalls and ends of the trenches are preferential wetting to said first block of the block copolymer;
    forming a neutral wetting layer on the floor of at least one trench wherein at least one other trench has a preferential wetting floor;
    forming a film comprising a cylindrical-phase block copolymer within the trenches to a thickness of about $L_o$; and
    annealing the block copolymer film to form perpendicularly-oriented cylindrical domains of a minority block of the block copolymer in a matrix of a majority block within trenches having the neutral wetting layer on the floor of the at least one trench, and parallel-oriented half-cylindrical domains of the minority block in a matrix of the majority block within trenches having a preferential wetting floor.

16. A method for fabricating nanoscale microstructures, comprising:
    forming a material layer on a substrate;
    forming a plurality of trenches in the material layer, each trench of the plurality having a width, length, sidewalls, ends and a floor, wherein the sidewalls and ends of the plurality of trenches are preferential wetting to a first block of a block copolymer;
    etching the floor of a first trench to a critical roughness for neutral wetting of said firstblock of the block copolymer;

forming a preferential wetting layer on the floor of a second trench;

forming a film comprising a cylindrical-phase block copolymer within the trenches to a thickness of about $L_o$; and annealing the block copolymer film to form perpendicularly-oriented cylindrical domains of a minority block of the block copolymer in a matrix of a majority block within the first trench having a neutral wetting floor, and parallel-oriented half-cylindrical domains of the minority block in a matrix of the majority block within the second trench having the preferential wetting layer on the floor of said trench.

17. The method of claim 16, wherein forming the preferential wetting layer comprises forming a layer of a material selected from the group consisting of oxide, nitride, silicon oxycarbide, silicon oxynitride, indium tin oxide, and a resist, selectively on the floor of the second trench.

18. A method for fabricating nanoscale microstructures, comprising:

forming a neutral wetting layer on a substrate, the substrate being preferential wetting to a first block of a block copolymer and the neutral wetting layer being wetting to blocks a second block of the block copolymer;

forming a material layer on the neutral wetting layer;

forming a plurality of trenches in the material layer, each trench of the plurality having a width, length, sidewalls, ends and a floor exposing the neutral wetting layer, wherein the sidewalls and ends of the trenches are preferential wetting to the first block of the block copolymer;

removing the neutral wetting layer from the floor of at least one trench to expose the preferential wetting substrate as the floor of the at least one trench wherein at least one trench retains the neutral wetting layer as the floor of the at least one trench;

forming a film comprising a cylindrical-phase block copolymer within the plurality of trenches to a thickness of about $L_o$; and annealing the block copolymer film to form perpendicularly-oriented cylindrical domains of a minority block of the block copolymer in a matrix of a majority block within the plurality of trenches having the neutral wetting layer as the floor of the at least one trench, and parallel-oriented half-cylindrical domains of the minority block in a matrix of the majority block within the trenches having the preferential wetting substrate as the floor of the at least one trench.

19. A method of etching a substrate, comprising: forming an etch mask, comprising:

forming a film comprising a cylindrical-phase block copolymer within a plurality of trenches to a thickness of about $L_o$, each trench of the plurality having a width, length, sidewalls, ends and a floor, wherein the sidewalls and ends of the plurality of trenches are preferential wetting to a first block of the block copolymer, and the floor of at least one trench is preferential wetting to the first block and the floor of another trench is neutral wetting to a second block of the block copolymer;

annealing the film to cause the copolymer to self-assemble to form perpendicularly-oriented cylindrical domains of a minority block of the block copolymer in a matrix of a majority block within the another trench having a neutral wetting floor, and parallel-oriented half-cylindrical domains of the minority block in a matrix of the majority block within the at least one trench having a preferential wetting floor; and selectively removing the minority polymer block to provide an array of perpendicular-oriented cylindrical openings and parallel-oriented half-cylindrical openings within the matrix of the majority polymer block; and etching the substrate through the openings of the etch mask.

20. The method of claim 19, further comprising extending the half-cylindrical openings to expose the floor of the at least one trench.

21. The method of claim 19, wherein the perpendicular-oriented cylindrical openings extend the length of at least one trench in a single array.

22. The method of claim 19, wherein the perpendicular-oriented cylindrical openings in at least one trench are in a hexagonal array.

* * * * *

UNITED STATES PATENT AND TRADEMARK OFFICE
CERTIFICATE OF CORRECTION

| | |
|---|---|
| PATENT NO. | : 8,404,124 B2 |
| APPLICATION NO. | : 11/761589 |
| DATED | : March 26, 2013 |
| INVENTOR(S) | : Dan B. Millward et al. |

It is certified that error appears in the above-identified patent and that said Letters Patent is hereby corrected as shown below:

In the Claims:

In column 12, line 66, in Claim 16, delete "firstblock" and insert -- first block --, therefor.

In column 13, line 24, in Claim 18, before "a" delete "blocks".

Signed and Sealed this
Twenty-eighth Day of May, 2013

Teresa Stanek Rea
*Acting Director of the United States Patent and Trademark Office*